(12) United States Patent
Wu et al.

(10) Patent No.: US 12,159,822 B2
(45) Date of Patent: Dec. 3, 2024

(54) METHOD OF MANUFACTURING A SEMICONDUCTOR PACKAGE HAVING CONDUCTIVE PILLARS

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW); Chung-Shi Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 97 days.

(21) Appl. No.: 17/805,594

(22) Filed: Jun. 6, 2022

(65) Prior Publication Data
US 2022/0302009 A1    Sep. 22, 2022

Related U.S. Application Data

(62) Division of application No. 16/784,508, filed on Feb. 7, 2020, now Pat. No. 11,355,428.
(Continued)

(51) Int. Cl.
*H01L 23/498*    (2006.01)
*H01L 21/56*    (2006.01)
(Continued)

(52) U.S. Cl.
CPC ...... *H01L 23/49833* (2013.01); *H01L 21/565* (2013.01); *H01L 23/145* (2013.01);
(Continued)

(58) Field of Classification Search
CPC ............ H01L 23/49833; H01L 21/565; H01L 23/145; H01L 23/29; H01L 23/3192; H01L 24/11
(Continued)

(56) References Cited

U.S. PATENT DOCUMENTS 8,987,922 B2    3/2015 Yu et al.
8,993,380 B2    3/2015 Hou et al.
(Continued)

FOREIGN PATENT DOCUMENTS

CN    109216213 A    1/2019
CN    109216219 A    1/2019
(Continued)

*Primary Examiner* — Quoc D Hoang
(74) *Attorney, Agent, or Firm* — Slater Matsil, LLP

(57) ABSTRACT

A semiconductor package includes an interconnect structure including a redistribution structure, an insulating layer over the redistribution structure, and conductive pillars on the insulating layer, wherein the conductive pillars are connected to the redistribution structure, wherein the interconnect structure is free of active devices, a routing substrate including a routing layer over a core substrate, wherein the interconnect structure is bonded to the routing substrate by solder joints, wherein each of the solder joints bonds a conductive pillar of the conductive pillars to the routing layer, an underfill surrounding the conductive pillars and the solder joints, and a semiconductor device including a semiconductor die connected to a routing structure, wherein the routing structure is bonded to an opposite side of the interconnect structure as the routing substrate.

20 Claims, 19 Drawing Sheets

Related U.S. Application Data

(60) Provisional application No. 62/906,953, filed on Sep. 27, 2019.

(51) Int. Cl.
*H01L 23/00* (2006.01)
*H01L 23/14* (2006.01)
*H01L 23/29* (2006.01)
*H01L 23/31* (2006.01)

(52) U.S. Cl.
CPC .......... *H01L 23/29* (2013.01); *H01L 23/3192* (2013.01); *H01L 24/11* (2013.01); *H01L 2224/11849* (2013.01)

(58) Field of Classification Search
USPC ........................................................ 257/737
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,196,532 B2 | 11/2015 | Tu et al. | |
| 9,196,559 B2 | 11/2015 | Tsai et al. | |
| 9,257,333 B2 | 2/2016 | Lu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,763,132 B2 | 9/2020 | Lin et al. | |
| 11,456,257 B2 | 9/2022 | Jeng et al. | |
| 2011/0291275 A1* | 12/2011 | Lin | H01L 24/48 257/737 |
| 2013/0175687 A1* | 7/2013 | Hu | H01L 25/105 257/738 |
| 2013/0270682 A1 | 10/2013 | Hu et al. | |
| 2016/0057863 A1 | 2/2016 | Kyozuka | |
| 2016/0118333 A1 | 4/2016 | Lin | |
| 2016/0148888 A1* | 5/2016 | Ryu | H01L 24/17 257/737 |
| 2018/0190581 A1 | 7/2018 | Lin | |
| 2019/0006200 A1 | 1/2019 | Lin et al. | |
| 2019/0103353 A1 | 4/2019 | Liu et al. | |
| 2020/0043908 A1 | 2/2020 | Chung et al. | |
| 2020/0118898 A1 | 4/2020 | Hu | |

FOREIGN PATENT DOCUMENTS

| | | |
|---|---|---|
| JP | 2016046418 A | 4/2016 |
| KR | 20130115073 A | 10/2013 |
| KR | 20190038357 A | 4/2019 |
| TW | I648826 B | 1/2019 |

\* cited by examiner

METHOD OF MANUFACTURING A SEMICONDUCTOR PACKAGE HAVING CONDUCTIVE PILLARS

PRIORITY CLAIM AND CROSS-REFERENCE

This application is a divisional of U.S. patent application Ser. No. 16/784,508, entitled "Semiconductor Package," filed Feb. 7, 2020, which claims the benefit of U.S. Provisional Application No. 62/906,953, entitled "Semiconductor Package and Method of Manufacture," filed on Sep. 27, 2019, which applications are hereby incorporated herein by reference.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
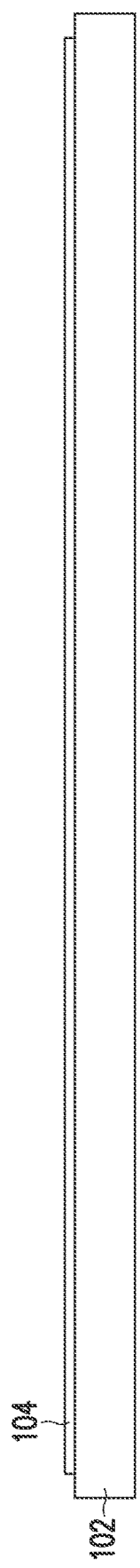
FIGS. 1 through 9 illustrate cross-sectional views of intermediate steps of forming an interconnect structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of packages and the formation thereof are described. In some embodiments, an interconnect structure is connected to a routing substrate using conductive pillars. The interconnect structure may include, for example, a redistribution structure, and the routing substrate may include, for example, an organic substrate. The use of conductive pillars allows for less solder to be used, which reduces the size of the solder joints used to connect the interconnect structure to the routing substrate. This can allow for more solder joints to be used without increase risk of electrical shorts forming between adjacent solder joints (e.g., "bridging"). The use of less solder can also allow for improved reliability of the solder joints. Additionally, electronic devices such as integrated passive devices (IPDs) or integrated voltage regulators (IVRs) may be incorporated into the package adjacent the conductive pillars to provide additional functionality to the package.

FIGS. 1 through 9 illustrate cross-sectional views of intermediate steps of forming an interconnect structure 100 (see FIG. 9), in accordance with some embodiments. Turning first to FIG. 1, there is shown a carrier substrate 102 on which a protective layer 104 has been formed, in accordance with some embodiments. The carrier substrate 102 may include, for example, silicon-based materials, such as a silicon substrate (e.g., a silicon wafer), a glass material, silicon oxide, or other materials, such as aluminum oxide, the like, or a combination. In some embodiments, the carrier substrate 102 may be a panel structure, which may be, for example, a supporting substrate formed from a suitable dielectric material, such as a glass material, a plastic material, or an organic material. The panel structure may be, for example, a rectangular panel.

Figure 22A:
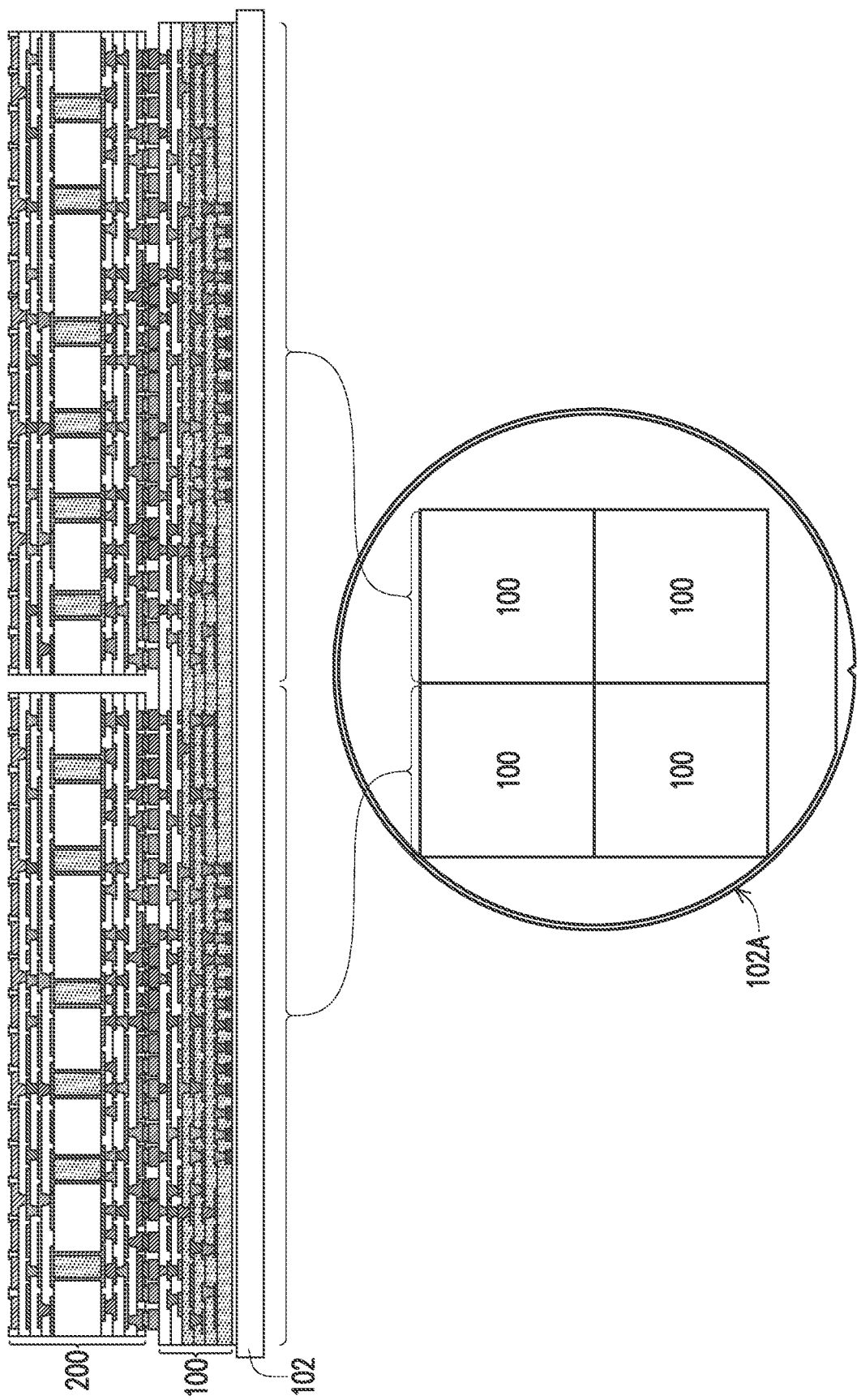
FIGS. 22A and 22B illustrate intermediate steps of forming a device structure on different types of carrier substrates, in accordance with some embodiments.
Figure 22B:
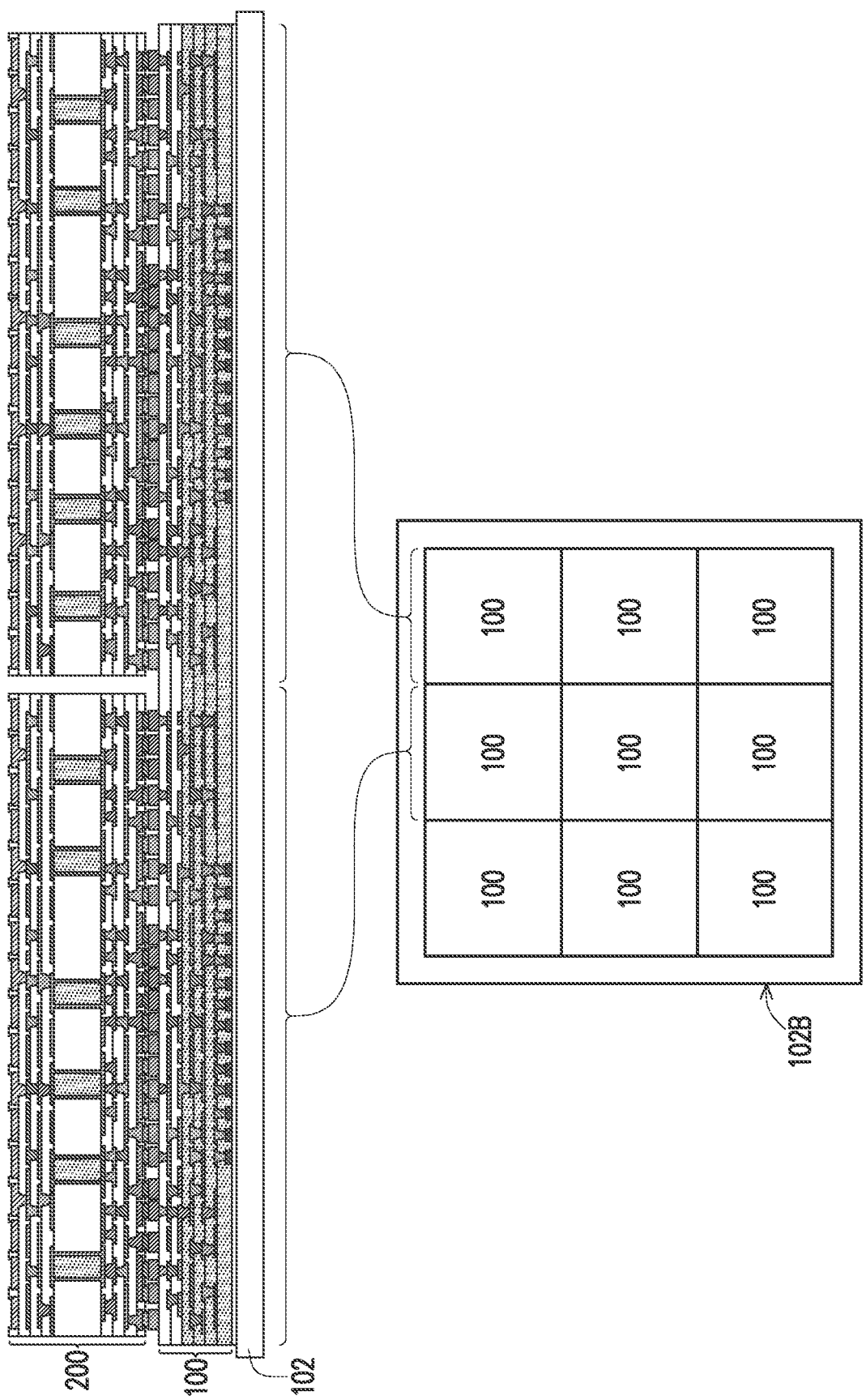

As illustrative examples, FIGS. 22A and 22B show interconnect structures 100 (see FIG. 9) formed using different types of carrier substrates 102, in accordance with some embodiments. FIGS. 22A and 22B show an intermediate processing step similar to that shown in FIG. 11, in which a routing substrate 200 (see FIG. 10) has been bonded to each interconnect structure 100. FIG. 22A shows an embodiment in which the carrier substrate 102 is a silicon wafer 102A, and FIG. 22B shows an embodiment in which the carrier substrate 102 is a panel structure 102B. FIGS. 22A and 22B show multiple interconnect structures 100 formed on the carrier substrates 102. In this manner, different types of carrier substrates 102 may be used to form multiple interconnect structures 100. The structures formed on the carrier substrate 102 may be subsequently singulated.

In some embodiments, a release layer (not shown) may be formed on the top surface of the carrier substrate 102 to facilitate subsequent debonding of carrier substrate 102. In some embodiments, the release layer may be formed of a polymer-based material, which may be removed along with the carrier substrate 102 from the overlying structures that will be formed in subsequent steps. In some embodiments, the release layer is an epoxy-based thermal-release material, which loses its adhesive property when heated, such as a Light-to-Heat-Conversion (LTHC) release coating. In other embodiments, the release layer may be an ultra-violet (UV) glue, which loses its adhesive property when exposed to UV light. The release layer may be dispensed as a liquid and cured, may be a laminate film laminated onto the carrier substrate 102, or the like. The top surface of the release layer may be leveled and may have a high degree of co-planarity. In some embodiments, a die attach film (DAF) (also not shown) may be used instead of or in addition to the release layer.

The protective layer 104 may be formed from one or more suitable dielectric materials such as polybenzoxazole (PBO), a polymer material, a polyimide material, a polyimide derivative, an oxide (e.g., silicon oxide or the like), a nitride (e.g. silicon nitride or the like), a molding compound, the like, or a combination thereof. In some embodiments, the protective layer 104 is formed of a photosensitive polymer such as PBO, polyimide, BCB, or the like, in which openings (e.g., openings 306 shown in FIG. 13) may be patterned directly using a photolithographic masking and etching process. The protective layer 104 may be formed by spin coating, lamination, CVD, the like, or a combination thereof. In some embodiments, the protective layer 104 may have a thickness between about 1 µm and about 50 µm.

Figure 2:
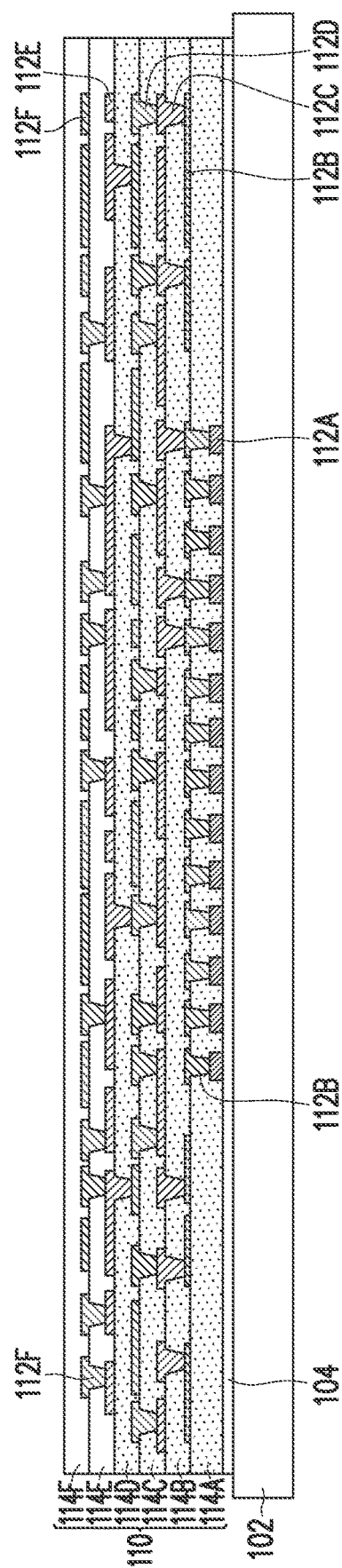

In FIG. 2, a redistribution structure 110 is formed over the protective layer 104, in accordance with some embodiments. The redistribution structure 110 provides electrical connection and routing between other components, such as a routing substrate 200 (see FIG. 10) or semiconductor devices 350 (see FIG. 15). The redistribution structure 110 shown includes insulating layers 114A-F and redistribution layers (RDLs) 112A-F. In other embodiments, different numbers of insulating layers or RDLs may be formed in the redistribution structure 110 than shown in FIG. 2. For example, in some embodiments, the redistribution structure 110 may include between about 1 and about 15 insulation layers or RDLs, or another number of insulation layers or RDLs. In some embodiments, the redistribution structure 110 may be, for example, a fan-out structure. In some embodiments, the redistribution structure 110 is free of active devices.

The insulating layers 114A-F may be formed of one or more suitable dielectric materials such as an oxide (e.g., silicon oxide), a nitride (e.g., silicon nitride), a polymer material, a polyimide material, a low-k dielectric material, a molding material (e.g., an EMC or the like), another dielectric material, the like, or a combination thereof. In some embodiments, different insulating layers 114A-F of the redistribution structure 110 may be formed of different dielectric materials. As an illustrative example, the insulating layers 114A-D shown in FIG. 2 are shown as being formed from a different dielectric material than the insulating layers 114E-F. In some embodiments, the insulating layers 114A-D may be formed from a molding compound, and the insulating layers 114E-F may be formed from a photosensitive polymer. The insulating layers 114A-F may be formed of different dielectric materials than these in other embodiments, and that the redistribution structure 110 may have any number, combination, or arrangement of different types of insulating layers, including those different from the example shown in FIG. 2. For example, the redistribution structure 110 may include a single insulating layer of a different dielectric material, or all of the insulating layers of the redistribution structure 110 may be the same dielectric material.

In some cases, the impedance of RDLs within the redistribution structure 110 can be controlled by forming one or more insulating layers from a different material and/or having a different thickness. An RDL (or conductive lines or vias thereof) may have a different impedance when formed on or within an insulating layer of a different material, and the impedance of the redistribution structure 110 may be controlled by using insulating layers of different materials. For example, by forming insulating layers 114A-D from a molding compound, the impedance of the RDLs 112A-D may be controlled according to a specific application or design. Controlling RDL impedance in this manner can allow more flexibility in the design of a package and can improve operational performance of the package. For example, insulating layers 114A-D may be used for SerDes routing, and insulating layers 114E-F may be used for single-ended or power/ground routing. Other configurations or applications are possible.

Still referring to FIG. 2, the redistribution structure 110 may be formed by forming a first RDL 112A over the protective layer 104. The RDL 112A may be a patterned conductive layer (e.g., a metallization pattern) that includes line portions (also referred to as conductive lines) and/or conductive pads that are formed on and extending along the major surface of the protective layer 104. In an embodiment, the RDL 112A may be formed by initially forming a seed layer (not shown). In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a suitable formation process such as PVD, CVD, sputtering, or the like. The seed layer is formed over the protective layer 104. A photoresist (not shown) may then be formed to cover the seed layer. The photoresist may be formed by spin-coating or the like and may be exposed to light for patterning. The patterning forms openings through the photoresist to expose those portions of the seed layer that are located where the RDL 112A will subsequently be formed. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may alternatively be used to form the RDL 112A. Once the conductive material has been formed, the photoresist may be removed through a suitable removal process such as an ashing process or a chemical stripping process, such as using oxygen plasma or the like. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the RDL 112A. Portions of the RDL 112A extending over the protective layer 104 may have a thickness of between about 1 µm and about 25 µm in some embodiments, although any suitable thickness may be used.

In some embodiments, first insulating layer 114A is then be formed over the protective layer 104 and the RDL 112A. The insulating layer 114A may be formed of one or more suitable dielectric materials such as an oxide (e.g., silicon oxide), a nitride (e.g., silicon nitride), a polymer material, a polyimide material, a low-k dielectric material, a molding material (e.g., an EMC or the like), another dielectric material, the like, or a combination thereof. The insulating layer 114A may be formed by a process such as spin-coating, lamination, CVD, the like, or a combination thereof. The insulating layer 114A may have a thickness between about 1 µm and about 50 µm, such as about 5 µm, although any suitable thickness may be used. In some embodiments, openings (not shown) into the insulating layer 114A may then be formed using a suitable photolithographic masking and etching process. For example, a photoresist may be formed and patterned over the insulating layer 114A, and one or more etching processes (e.g., a wet etching process or a dry etching process) are utilized to remove portions of the insulating layer 114A. In some embodiments, the insulating layer 114A is formed of a photosensitive polymer such as PBO, polyimide, BCB, or the like, in which openings may be patterned directly using a photolithographic masking and etching process. The openings in the insulating layer 114A may expose regions of the RDL 112A.

The RDL 112B may then formed over the insulating layer 114A. The RDL 112B may be a patterned conductive layer (e.g., a metallization pattern) that includes line portions on and extending along the major surface of the insulating layer 114A. The RDL 112B further includes via portions (also referred to as conductive vias) extending through the insulating layer 114A to physically and electrically connect to the RDL 112A.

In some embodiments, the RDL 112B may be formed in a manner similar to that of the RDL 112A. For example, a seed layer may be formed over the insulating layer 114A and over regions of the RDL 112A exposed by openings in the insulating layer 114A. A photoresist may then be formed to cover the seed layer and then be patterned to expose those portions of the seed layer that are located where the RDL 112B will subsequently be formed. Once the photoresist has been formed and patterned, a conductive material may be formed on the seed layer. The conductive material may be a material similar to those described above for the RDL 112A, and may be formed using a similar process such as electroplating, electroless plating, or the like. Once the conductive material has been formed, the photoresist and covered portions of the seed layer may be removed using one or more suitable wet etch processes or dry etch processes, which may use the conductive material as an etch mask. The remaining portions of the seed layer and conductive material form the RDL 112B. Portions of the RDL 112B extending over the insulating layer 114A may have a thickness of between about 1 µm and about 25 µm in some embodiments, although any suitable thickness may be used.

In other embodiments, the insulating layer 114A or RDL 112B may be formed using other techniques. For example, the process used to form the RDL 112B may be determined by the material used to form the insulating layer 114A. In some embodiments having an insulating layer 114A formed of a molding compound or the like, via portions of RDL 112B extending through insulating layer 114A may be formed on RDL 112A before forming the insulating layer 114A. In an embodiment, the via portions of RDL 112B may be formed by initially forming a seed layer (not shown) over the protective layer 104 and the RDL 112A. The seed layer may be a single layer of a metallic material or a composite layer comprising multiple sub-layers formed of different metallic materials. In some embodiments, the seed layer comprises a titanium layer and a copper layer over the titanium layer, though the seed layer may comprise different materials or different layers in other embodiments. The seed layer may be formed using a suitable process such as PVD, CVD, sputtering, or the like. A photoresist (not shown) may then be formed to cover the seed layer and patterned to expose those portions of the seed layer that are located where the via portions of RDL 112B will subsequently be formed. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may alternatively be used to form the via portions of RDL 112B. Once the conductive material has been formed, the photoresist may be removed through a suitable removal process such as an ashing process or a chemical stripping process, such as using oxygen plasma or the like.

After forming the vias portions of the RDL 112B, the insulating layer 114A may be deposited over the via portions. The insulating layer 114A may then be planarized (e.g., using a CMP or grinding process) to expose the via portions of the RDL 112B. The insulating layer 114A may have a thickness between about 1 µm and about 50 µm, such as about 5 µm, although any suitable thickness may be used.

Conductive line portions of the RDL 112B extending over the via portions and over the insulating layer 114A may be formed using techniques similar to those used to form RDL 112A, described above. For example, a seed layer may be formed over the insulating layer 114A and over the via portions of the RDL 112B. A photoresist may then be formed to cover the seed layer and then be patterned to expose those portions of the seed layer that are located where the conductive line portions of the RDL 112B will subsequently be formed. Once the photoresist has been formed and patterned, a conductive material may be formed on the seed layer. The conductive material may be a material similar to those described above for the RDL 112A, and may be formed using a similar process such as electroplating, electroless plating, or the like. Once the conductive material has been formed, the photoresist and covered portions of the seed layer may be removed using one or more suitable wet etch processes or dry etch processes, which may use the conductive material as an etch mask. The remaining portions of the seed layer and conductive material form the conductive line portions of the RDL 112B.

Still referring to FIG. 2, additional insulating layers 114B-F and RDLs 112C-F may then be formed over the RDL 112B and the insulating layer 114A to provide additional routing and electrical connections within the redistribution structure 110. The insulating layers 114B-F and the RDLs 112C-F may be formed in alternating layers. In some embodiments, the redistribution structure 110 may include different types of insulating layers, such as insulating layers formed from different materials and/or different processes. The insulating layers 114B-F and the RDLs 112C-F may be formed using suitable materials and processes, such as those described above for the insulating layer 114A and the RDL 112B. The processes for forming insulation layers and RDLs may be repeated to form the redistribution structure 110 having a suitable number and configuration of insulation layers and RDLs.

Figure 11:
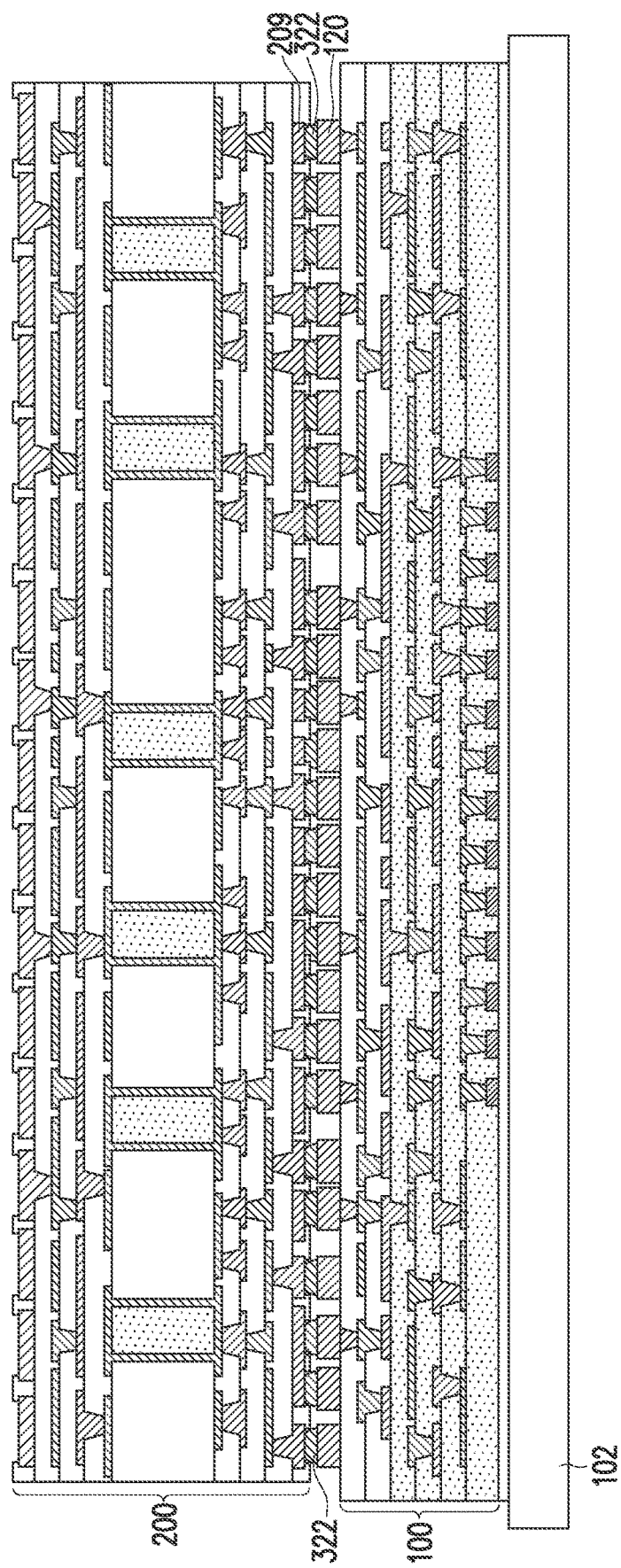

Turning to FIGS. 3 through 9, intermediate process steps are shown in the formation of conductive pillars 120 (see FIG. 6) over the redistribution structure 110, in accordance with some embodiments. The conductive pillars 120 are used to physically and electrically connect the redistribution structure 110 to other structures, (e.g., the routing substrate 200 as shown in FIG. 11). The use of conductive pillars 120 as described herein can reduce the amount of solder used for each connection between the redistribution structure 110 and another structure, which can reduce the chance of electrical shorts (e.g., "bridging") between adjacent connections.

Figure 3:
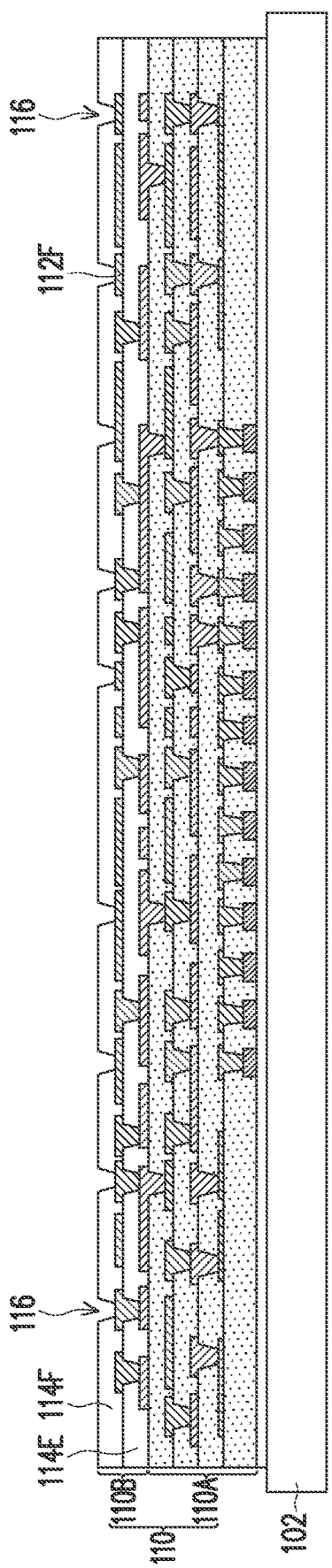

In FIG. 3, openings 116 are formed in the topmost insulating layer of the redistribution structure 110 (e.g., the insulating layer 114F). The openings 116 expose regions of the topmost RDL of the redistribution structure (e.g., the RDL 112F). The openings 116 may be formed using a suitable photolithographic masking and etching process. For example, a photoresist or photoresist structure may be formed over the insulating layer 114A and then patterned. One or more etching processes (e.g., a wet etching process or a dry etching process) may then be utilized to remove portions of the insulating layer 114A, forming openings 116. In some embodiments, the insulating layer 114A is formed of a photosensitive polymer such as PBO, polyimide, BCB, or the like, in which the openings 116 may be patterned directly using a suitable photolithographic masking and etching process.

Figure 4:
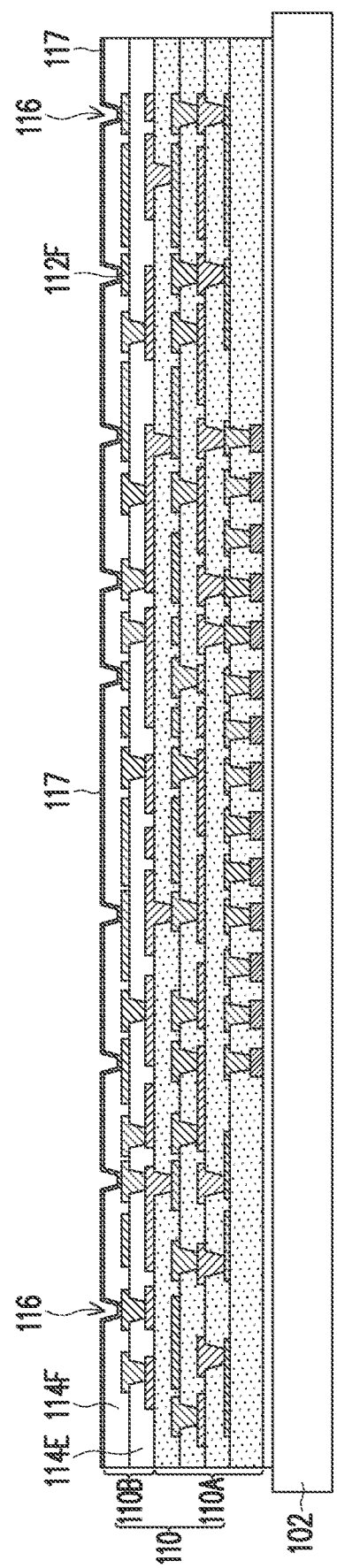

Turning to FIG. 4, a seed layer 117 is formed over the insulating layer 114F and within the openings 116, in accordance with some embodiments. In some embodiments, the seed layer 117 is a metal layer, which may be a single layer or a composite layer comprising multiple sub-layers formed of different materials. In some embodiments, the seed layer 117 comprises a titanium layer and a copper layer over the titanium layer, though the seed layer 117 may comprise different materials or different layers in other embodiments. The seed layer 117 may be formed using a suitable process such as PVD, CVD, sputtering, or the like.

Figure 5:
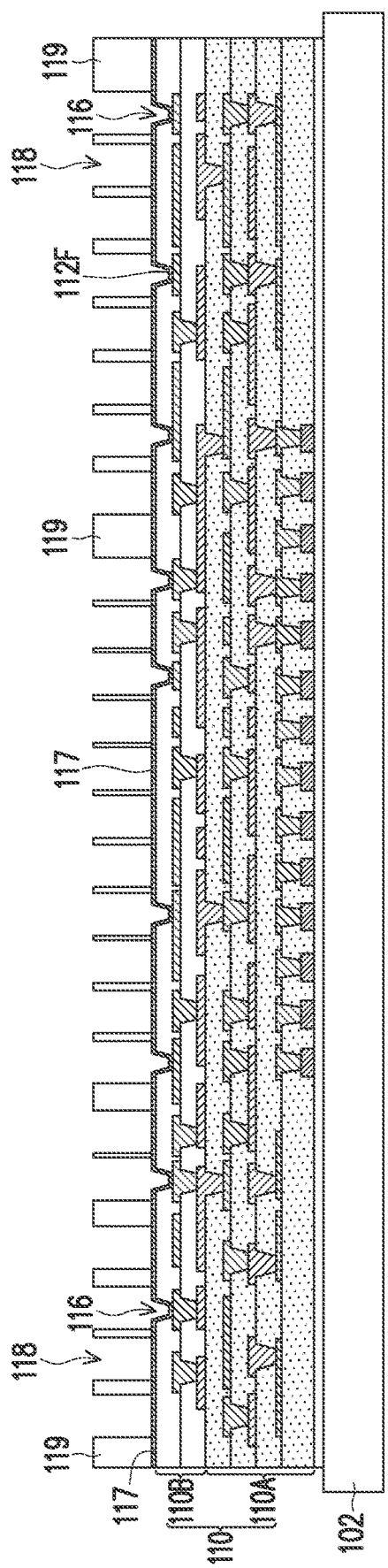

Turning to FIG. 5, a photoresist 119 is formed over the seed layer 117 and patterned, in accordance with some embodiments. The photoresist 119 may be formed by spin-coating or the like and may be exposed to light for patterning. The patterning forms openings 118 through the photoresist 119 to expose those portions of the seed layer 117 that are located where the conductive pillars 120 will subsequently be formed.

Figure 6:
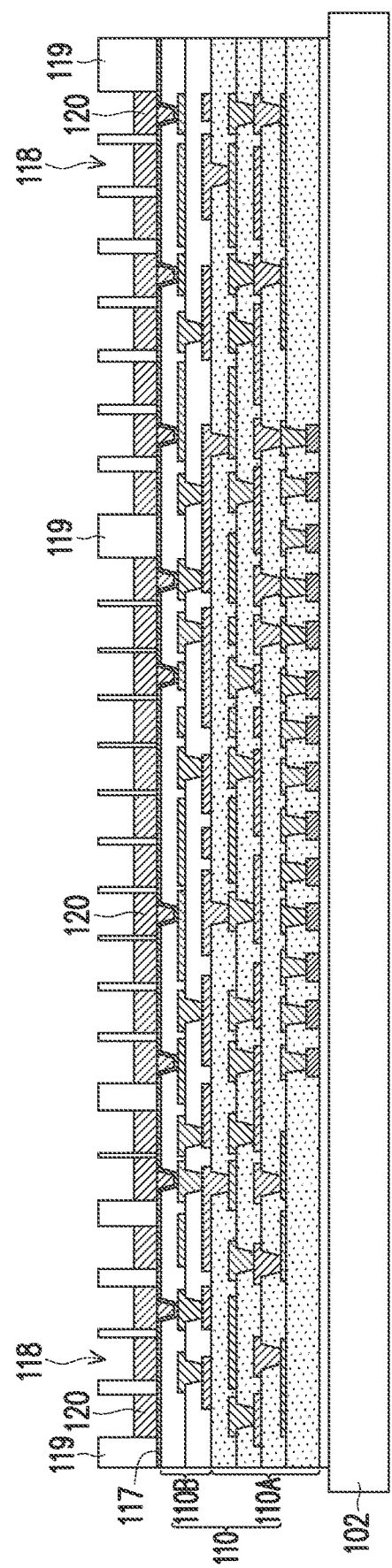

Turning to FIG. 6, conductive pillars 120 are formed, in accordance with some embodiments. The conductive pillars 120 may be formed by depositing a conductive material on the seed layer 117 that is exposed by the openings 118 in the photoresist 119. The conductive material may be copper, though in other embodiments, other materials may be used such as a copper alloy, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may alternatively be used to form the conductive pillars 120. In some embodiments, the conductive pillars 120 have substantially straight sidewalls, which may be substantially vertical or which may have a tapered profile. Other sidewall profiles are also possible, and such variations of shape, proportions, or profile are considered within the scope of the present disclosure.

Figure 7:
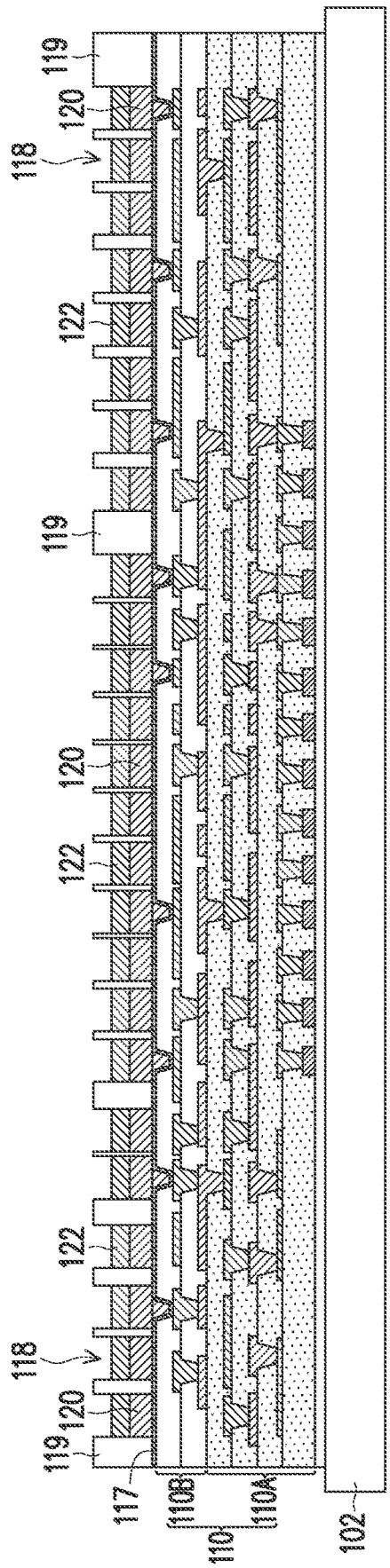

Turning to FIG. 7, a solder cap 122 is formed on the top of each of the conductive pillars 120, in accordance with some embodiments. In this manner, the conductive pillars 120 may be considered Under-Bump Metallizations (UBMs) in some embodiments. The solder caps 122 may include a solder material such as tin, tin-lead, gold, silver, tin-silver, tin-bismuth, copper, tin-copper, tin-copper-silver, palladium, indium, nickel, nickel-palladium-gold, nickel-gold, the like, or a combination thereof. The solder caps 122 may be formed using a plating process, though other techniques may be used such as evaporation, printing, solder transfer, ball placement, or the like. In some embodiments, the solder caps 122 are formed having a thickness that is between about 3 μm and about 100 μm. The solder caps 122 may be formed having about the same width as the width W1 (see FIG. 9) of the conductive pillars 120. In some embodiments, solder caps 122 are not formed on the conductive pillars 120.

Figure 8:
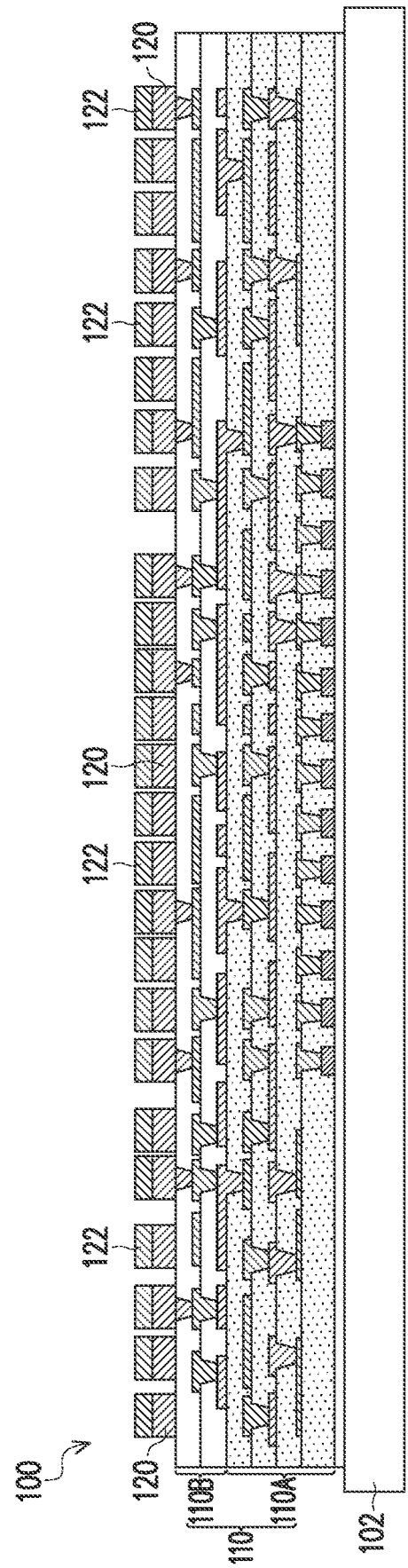

Turning to FIG. 8, the photoresist 119 is removed to form an interconnect structure 100, in accordance with some embodiments. Once the conductive pillars 120 and solder cap 122 have been formed, the photoresist 119 may be removed using a suitable process such as a suitable wet etch process or a dry etch process, such as using a chemical stripping process, an ashing process, an oxygen plasma process, or the like. The portions of the seed layer 117 that are not covered by conductive pillars 120 may be removed using one or more suitable wet etch processes or dry etch processes, which may use the conductive pillars 120 as an etch mask. For clarity, the seed layer 117 is not shown in FIG. 8 or in subsequent Figures, though a portion of the seed layer 117 may be present beneath each conductive pillar 120.

Figure 9:
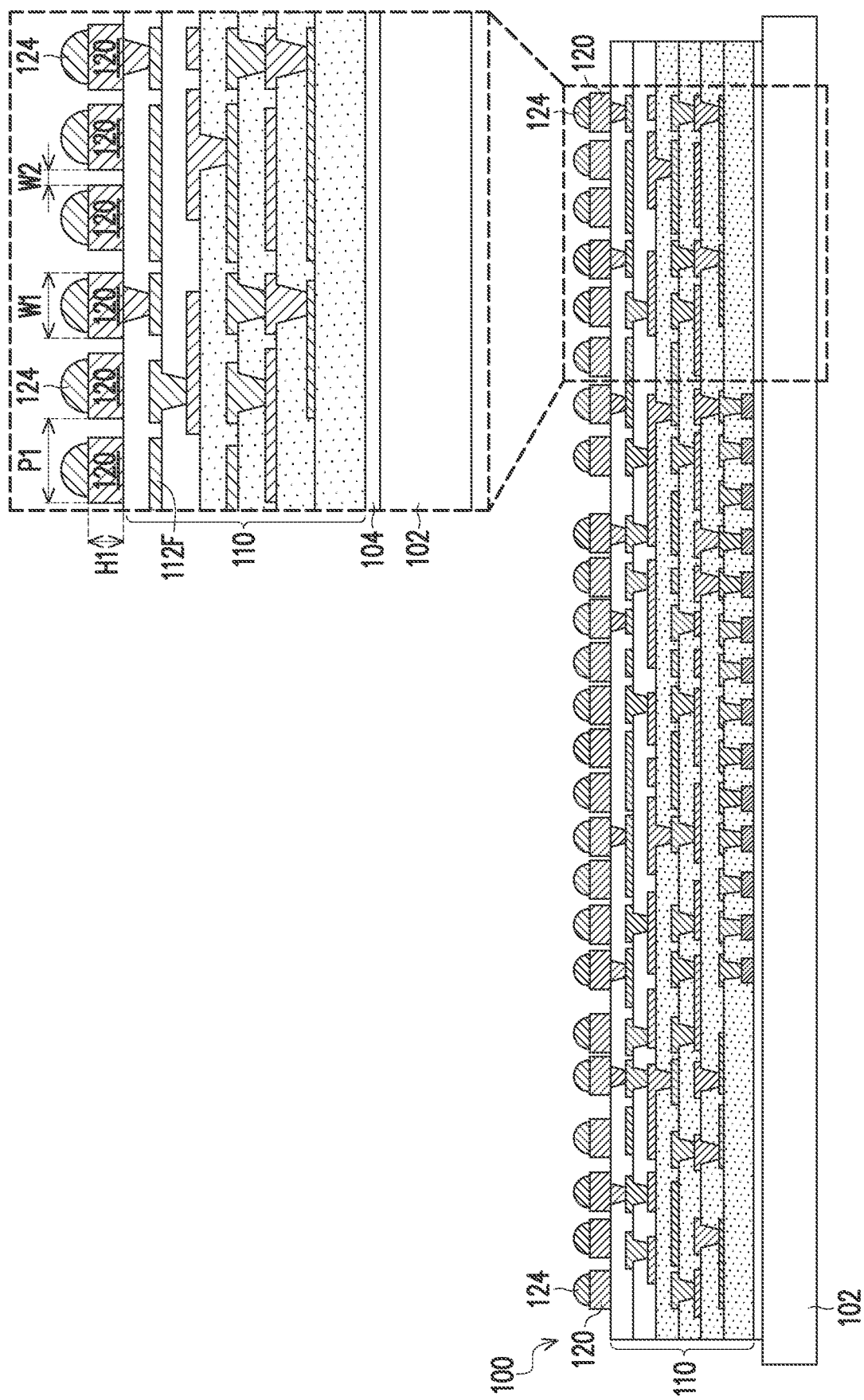

FIG. 9 shows the interconnect structure 100 after a reflow process has been performed to form solder bumps 124, in accordance with some embodiments. FIG. 9 also shows a magnified portion of the interconnect structure 100, in accordance with some embodiments. The reflow process may be performed in order to reshape the solder material of the solder caps 122 into solder bumps 124. The solder bumps 124 may be used to facilitate bonding of another component to the interconnect structure 100, described below in FIGS. 10 and 11. In this manner, a conductive pillar 120 and a solder bump 124 may together be considered a connector. After the reflow process, the solder bumps 124 may have a smaller width than the width of the solder caps 122 or may have a smaller width than the width W1 of the conductive pillars 120, as shown in FIG. 9. In some embodiments, the conductive pillars 120 have a width W1 that is between about 20 µm and about 650 µm, such as about 225 µm. In some embodiments, the solder bumps 124 do not extend beyond the sidewalls of the conductive pillars 120. In some embodiments, no reflow process is performed on the solder caps 122 prior to bonding the interconnect structure 100 to another structure (e.g., to the routing substrate 200 shown in FIG. 11).

In some cases, by forming the solder bumps 124 on conductive pillars 120 as described herein, the size of each solder bump 124 or the amount of solder material within each solder bump 124 may be reduced. For example, the amount of solder material used for a solder bump 124 formed on a conductive pillar 120 may be less than the amount of solder material used for a solder bump formed on the redistribution structure 110 without a conductive pillar 120. The amount of solder material used for a solder bump 124 may be reduced due to the additional height H1 above the redistribution structure 110 provided by the conductive pillars 120. For example, in order to extend a suitable height above the redistribution structure 110, a solder bump formed directly on the redistribution structure 110 may have a larger size or have more solder material than a solder bump 124 formed on a conductive pillar 120. In some embodiments, the conductive pillars 120 may be have a height H1 that is between about 5 µm and about 200 Reducing the size of the solder bumps 124 can reduce the chance of electrical shorts (e.g., "bridging") forming between adjacent solder bumps 124. In some cases, the use of less solder material such as described for the solder bumps 124 may cause less deformation of the solder material during subsequently performed thermal processes, and thus may improve the quality of joints formed using the solder bumps 124 (e.g., solder joints 322 shown in FIG. 11).

In some cases, the conductive pillars 120 may have substantially vertical sidewalls that allow for adjacent conductive pillars 120 to have a smaller pitch P1 than other types of connectors. In some embodiments, the conductive pillars 120 have a pitch P1 that is between about 150 µm and about 1,000 µm, such as about 350 µm. Additionally, the reduced chance of bridging between solder bumps 124 due to the use of conductive pillars 120 may allow the conductive pillars 120 to be formed having a smaller separation distance W2. In some cases, this allows for a greater density of conductive pillars 120 to be formed on an interconnect structure 100. In this manner, the use of conductive pillars 120 as described herein can allow for a greater number of connectors to be formed on the interconnect structure 100 to provide electrical connections to another structure of a package (e.g., package 300 shown in FIG. 15). This can allow for more flexibility in the design of the package. In some cases, increasing the number of electrical connections between the interconnect structure 100 and another structure within a package can improve the electrical performance of the package. For example, more connections can allow for improved synchronization between electrical signals within the package or improved synchronization between power routing and ground routing within the package.

Figure 10:
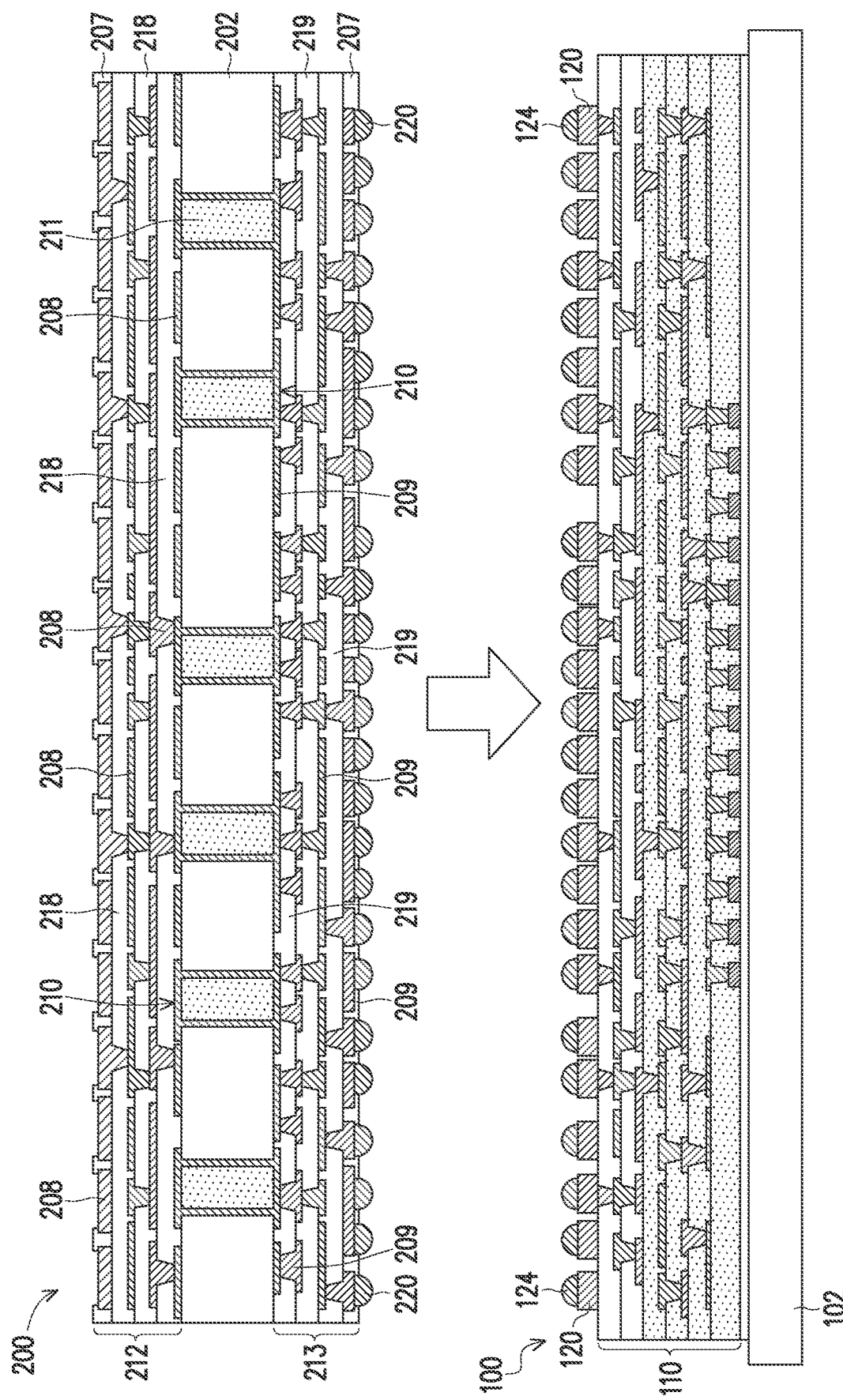
FIGS. 10 and 11 illustrate cross-sectional views of intermediate steps of attaching an interconnect structure to a routing substrate, in accordance with some embodiments.

FIGS. 10 and 11 illustrate the attachment of a routing substrate 200 to the interconnect structure 100, in accordance with some embodiments. The routing substrate 200 provides additional routing and stability to the interconnect structure 100. For example, the routing substrate 200 can reduce warping of the interconnect structure 100, especially for an interconnect structure 100 having a relatively large areas (e.g., greater than about 90 mm²).

Turning to FIG. 10, a routing substrate 200 and an interconnect structure 100 are shown prior to attachment, in accordance with some embodiments. In some embodiments, the routing substrate 200 may be, for example, an interposer or a "semi-finished substrate," and may be free of active devices. In some embodiments, the routing substrate 200 may include routing layers formed on a core substrate 202. The core substrate 202 may include a material such as Ajinomoto build-up film (ABF), a pre-impregnated composite fiber (prepreg) material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate 202 may be a double-sided copper-clad laminate (CCL) substrate or the like. The core substrate 202 may have a thickness between about 30 µm and about 2000 µm, such as about 500 µm or about 1200 µm.

The routing substrate 200 may have one or more routing structures 212/213 formed on each side of the core substrate 202 and through vias 210 extending through the core substrate 202. The routing structures 212/213 and through vias 210 provide additional electrical routing and interconnection. The routing structures 212/213 may include one or more routing layers 208/209 and one or more dielectric layers 218/219. In some embodiments, the routing layers 208/209 and/or through vias 210 comprise one or more layers of copper, nickel, aluminum, other conductive materials, the like, or a combination thereof. In some embodiments, the dielectric layers 218/219 comprise materials such as a build-up material, ABF, a prepreg material, a laminate material, another material similar to those described above for the core substrate 202, the like, or combinations thereof. The routing substrate 200 shown in FIG. 10 shows two routing structures 212/213 having a total of six routing layers 208/209, but more or fewer routing layers may be formed on either side of the core substrate 202 in other embodiments.

In some embodiments, the openings in the core substrate 202 for the through vias 210 may be filled with a filler material 211. The filler material 211 may provide structural support and protection for the conductive material of the through via 210. In some embodiments, the filler material 211 may be a material such as a molding material, epoxy, an epoxy molding compound, a resin, materials including monomers or oligomers, such as acrylated urethanes, rubber-modified acrylated epoxy resins, or multifunctional monomers, the like, or a combination thereof. In some embodiments, the filler material 211 may include pigments or dyes (e.g., for color), or other fillers and additives that modify rheology, improve adhesion, or affect other properties of the filler material 211. In some embodiments, the conductive material of the through vias 210 may completely fill the through vias 210, omitting the filler material 211.

In some embodiments, the routing substrate 200 may include a passivation layer 207 formed over one or more sides of the routing substrate 200. The passivation layer 207 may be a material such as a nitride, an oxide, a polyimide, a low-temp polyimide, a solder resist, combinations thereof, or the like. Once formed, the passivation layer 207 may be patterned (e.g., using a suitable photolithographic masking and etching process) to expose portions of the routing layers 208/209 of the routing structures 212/213.

In some embodiments, external connectors 220 are formed on an outermost routing layer of the routing substrate 200. For example, the external connectors 220 shown in FIG. 10 are formed on the outermost routing layer 209 of the routing structure 213. In some embodiments, Under- Bump Metallizations (UBMs, not shown in FIG. 10) may be formed on the routing layer, and then the external connectors 220 may be formed on the UBMs. The external connectors 220 may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The external connectors 220 may include a conductive material such as solder, copper, aluminum, gold, nickel, silver, palladium, tin, the like, or a combination thereof. In some embodiments, the external connectors 220 are formed by initially forming a layer of solder through evaporation, electroplating, printing, solder transfer, ball placement, or the like. Once a layer of solder has been formed on the structure, a reflow may be performed in order to shape the material into the desired bump shapes.

FIG. 11 illustrates the attachment of the routing substrate 200 to the interconnect structure 100, in accordance with some embodiments. In an embodiment, the external connectors 220 of the routing substrate 200 are placed into physical contact with corresponding conductive pillars 120 of the interconnect structure 100 using, e.g., a pick and place process. Once in physical contact, a reflow process may be utilized to bond the external connectors 220 of the routing substrate 200 and the solder bumps 124 of the interconnect structure 100, forming solder joints 322 that make physical and electrical connection between the interconnect structure 100 and the routing substrate 200. In some cases, the use of solder bumps 124 and conductive pillars 120 on the interconnect structure 100 as described previously may allow a smaller amount of solder material to be used for the external connectors 220 of the routing substrate 200 in order to form solder joints 322. In this manner, the solder joints 322 may be formed having a smaller size, which can reduce the chance of bridging or deformation during the reflow process or during subsequent thermal processes. The smaller size of the solder joints 322 also may allow for a greater density of connections between the interconnect structure 100 and the routing substrate 200, as described above. In some cases, a width of each solder joint 322 is less than the width W1 of the respective first conductive pillar 120 to which it is connected.

Figure 12:
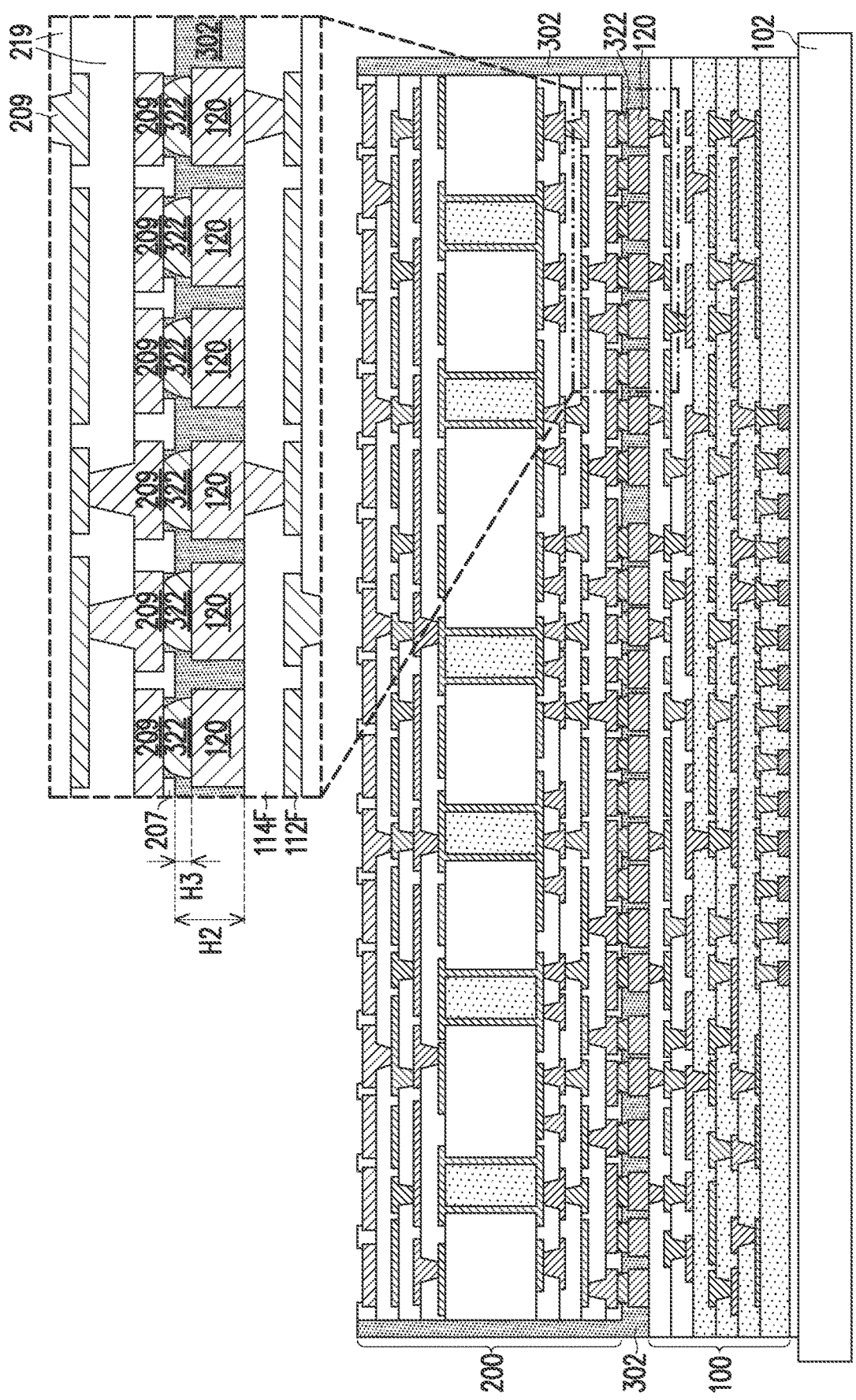
FIGS. 12 through 15 illustrate cross-sectional views of intermediate steps of forming a package, in accordance with some embodiments.

In FIG. 12, an underfill 302 is deposited along the sidewalls of the routing substrate 200 and in the gap between the interconnect structure 100 and the routing substrate 200. FIG. 12 also shows a magnified portion of the "transition layer" where the interconnect structure 100 is attached to the routing substrate 200 by the solder joints 322, in accordance with some embodiments. The underfill 302 may be a material such as a molding compound, an epoxy, an underfill, a molding underfill (MUF), a resin, or the like. The underfill 302 can protect the solder joints 322 and provide structural support for the interconnect structure 100. In some embodiments, the underfill 302 may be cured after deposition. In some embodiments, the underfill 302 may be thinned after deposition. The thinning may be performed, e.g., using a grinding or CMP process. In some embodiments, the underfill 302 may be deposited over the routing substrate 200, and the thinning may expose the topmost routing layer of the routing substrate 200. In some cases, forming the solder joints 322 having a smaller size as described above can reduce the chance of delamination of the solder joints 322 from the underfill 302 during subsequent thermal processes. In this manner, yield and joint quality can be improved during processing.

In some embodiments, the proximal layers of the interconnect structure 100 and the routing substrate 200 are separated by a distance H2 that is between about 20 μm and about 500 μm. The proximal layers may be, for example, the topmost insulating layer (e.g., 114F) of the interconnect structure 100, a passivation layer 207 of the routing substrate 200, or the like. In some embodiments, the height H1 of the conductive pillars 120 may be between about 2% and about 80% of the separation distance H2. For example, the height H1 of the conductive pillars 120 may be greater than about half of the separation distance H2. In some cases, the use of conductive pillars 120 allows for a larger separation distance H2, which can allow for the inclusion of other devices within the transition layer. For example, an embodiment is described below for FIG. 21 in which an electronic device 710 is placed between the interconnect structure 100 and the routing substrate 200. In some embodiments, the separation distance H3 between the conductive pillars 120 and the routing substrate 200 may be between about 0 μm and about 100 μm. In some embodiments, the separation distance H3 is less than the height H1 of the conductive pillars 120. In some cases, the use of conductive pillars 120 reduces the separation distance H3, which reduces the area of the solder joints 322 that is covered by underfill 302. By reducing the size of the interface between the solder joints 322 and the underfill 302, the chance of delamination causing failure or degradation of the solder joints 322 may be reduced.

Figure 13:
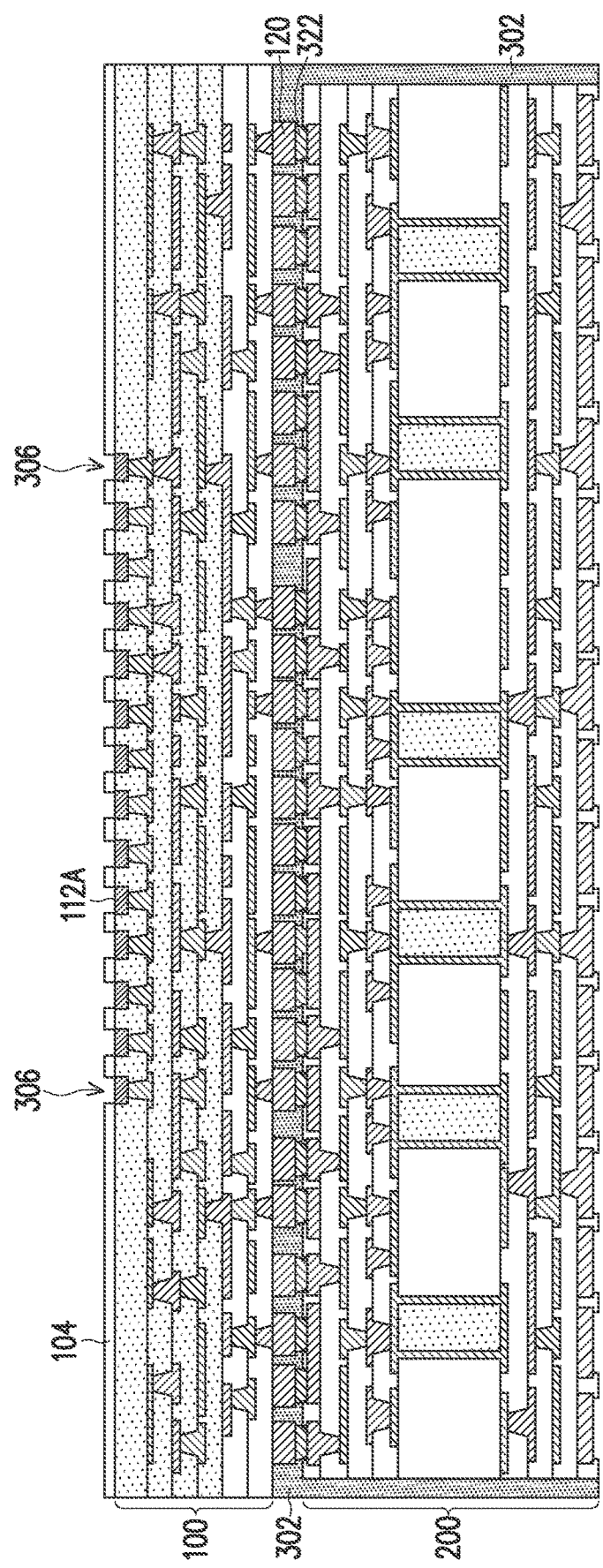

Turning to FIG. 13, the carrier substrate 102 is de-bonded to detach (or "de-bond") the carrier substrate 102 from the interconnect structure 100. In some embodiments, the de-bonding includes projecting a light such as a laser light or an UV light on a release layer on the carrier substrate 102 so that the release layer decomposes under the heat of the light and the carrier substrate 102 can be removed. In other embodiments, the de-bonding process may be performed before or after a different process step than shown in the Figures.

After de-bonding the carrier substrate 102, the structure may be flipped over and openings 306 formed in the protective layer 104. The openings 306 may be formed using a suitable photolithographic masking and etching process. For example, a photoresist may be formed and patterned over the protective layer 104, and one or more etching processes (e.g., a wet etching process or a dry etching process) are utilized to remove portions of the protective layer 104 to form the openings 306. In some embodiments, the protective layer 104 is formed of a photosensitive material, and the openings 306 may be patterned directly using a photolithographic masking and etching process. The openings 306 in the protective layer 104 may expose conductive regions (e.g., RDL 112A) of the interconnect structure 100 so that components may be electrically connected to the interconnect structure 100, described below.

Figure 14:
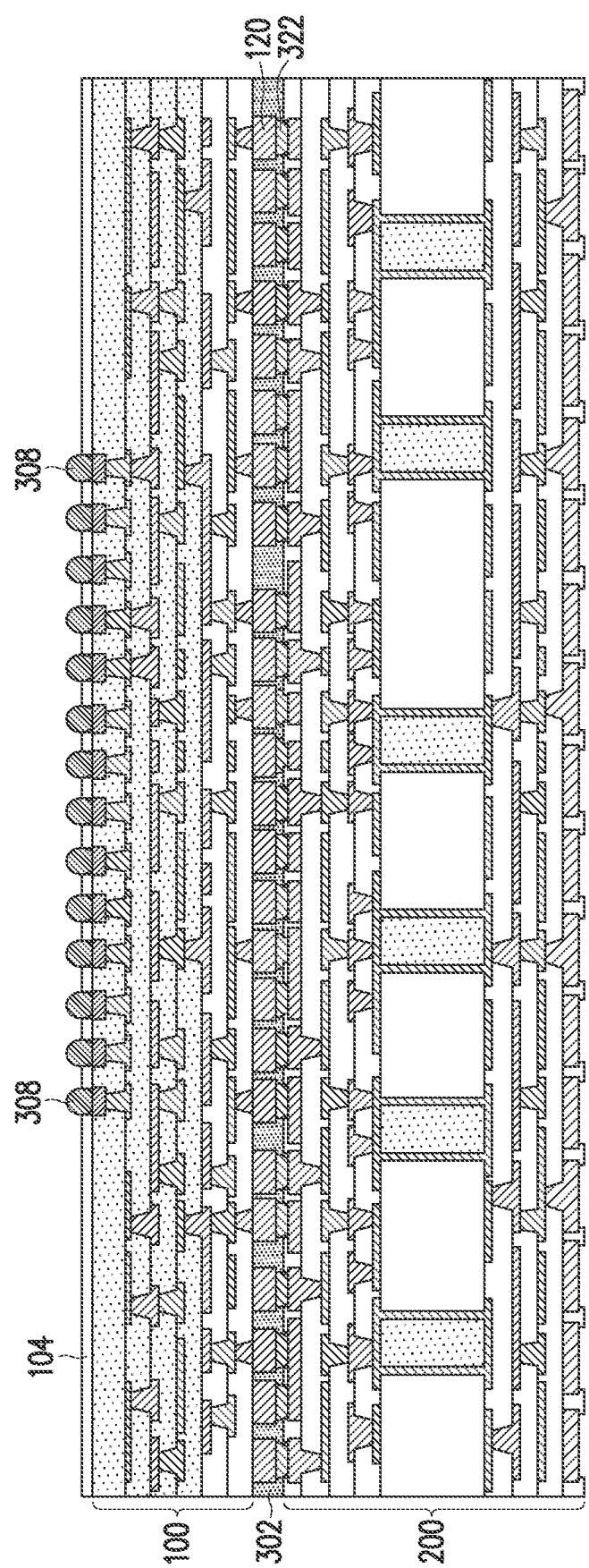

Turning to FIG. 14, external connectors 308 are formed in the openings 306, in accordance with some embodiments. The external connectors 308 make physical and electrical connection to the interconnect structure 100, such as contacting the RDL 112A exposed by the openings 306. In some embodiments, the external connectors 308 may be ball grid array (BGA) connectors, solder balls, controlled collapse chip connection (C4) bumps, micro bumps (e.g., μbumps), electroless nickel-electroless palladium-immersion gold technique (ENEPIG) formed bumps, or the like. The external connectors 308 may include a conductive material such as solder, copper, aluminum, gold, nickel, silver, palladium, tin, the like, or a combination thereof. In some embodiments, the external connectors 308 is formed by initially forming a layer of solder through evaporation, electroplating, printing, solder transfer, ball placement, or the like.

Once a layer of solder has been formed on the structure, a reflow may be performed in order to shape the material into the desired shapes. In other embodiments, conductive pillars similar to the conductive pillars 120 are formed in the openings 306. An example embodiment of forming conductive pillars 620 within the openings 306 is described below for FIGS. 19 and 20.

Still referring to FIG. 14, a singulation process may be performed to singulate multiple structures formed on the carrier substrate 102 into separate structures. The singulation process may include a sawing process, a laser process, or the like. As shown in FIG. 14, the singulation process may remove underfill 302 from the sidewalls of the routing substrate 200, exposing the sidewalls of the routing substrate 200. In other embodiments, underfill 302 remains on the sidewalls of the routing substrate 200 after the singulation process. As shown in FIG. 14, the interconnect structure 100 and the routing substrate 200 may have coplanar sidewalls after the singulation process. In other embodiments, the singulation process may be performed before or after a different process step than shown in the Figures.

Figure 15:
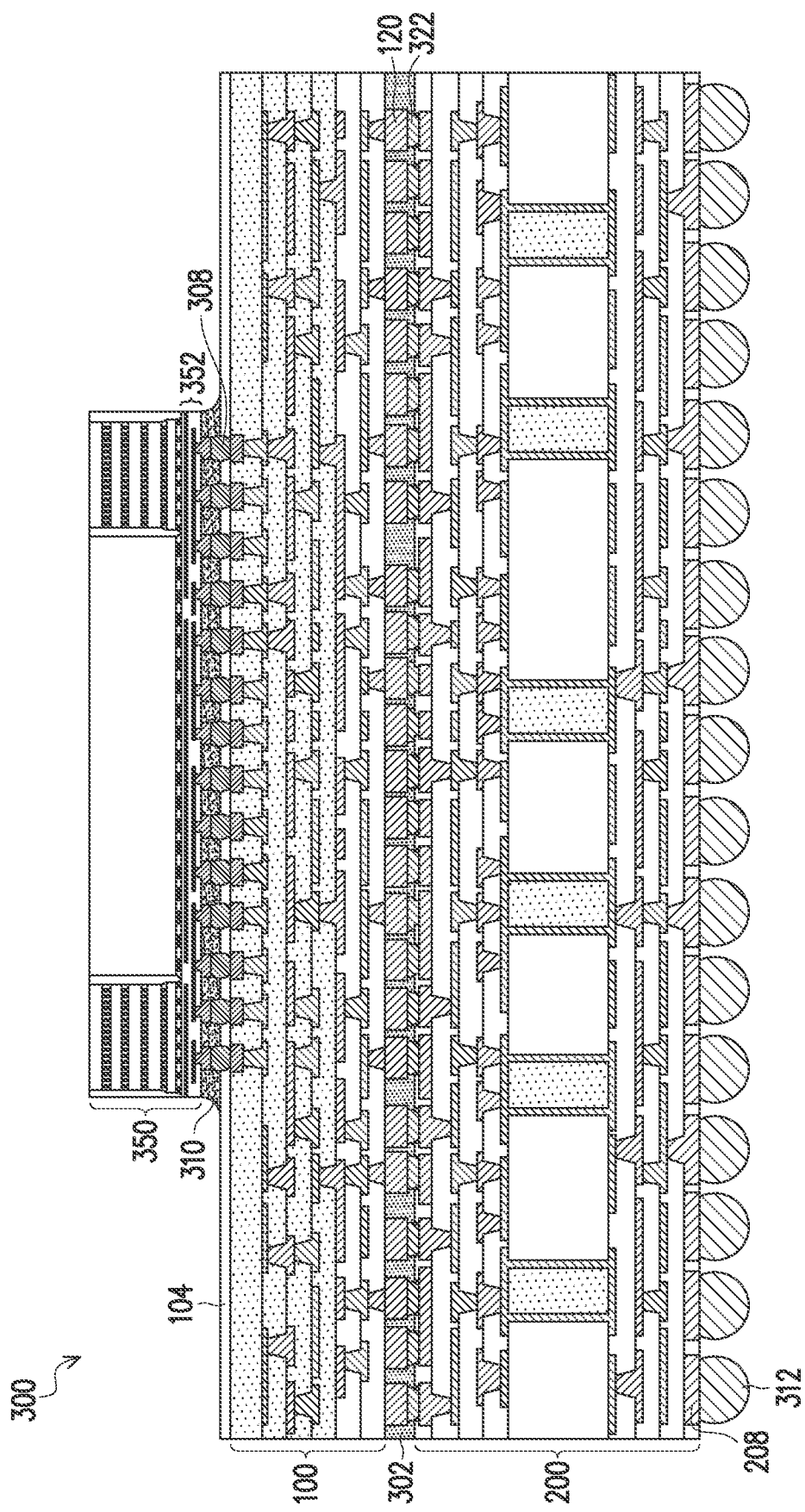

FIG. 15 illustrates the attachment of semiconductor devices 350 to the external connectors 308 to form a package 300, in accordance with some embodiments. The semiconductor devices 350 are physically and electrically connected to the external connectors 308 to make electrical connection between the semiconductor devices 350 and the interconnect structure 100. In some embodiments, the semiconductor devices 350 are attached to a routing structure 352, and the routing structure 352 is connected to the external connectors 308. The routing structure 352 may include metallization patterns, conductive lines, conductive traces, vias, or the like that provide interconnection and additional routing between the semiconductor devices 350. The routing structure 352 may be a redistribution structure comprising conductive layers and insulating layers, in some embodiments. The routing structure 352 may include contact pads that are physically and electrically connected to the external connectors 308. In some embodiments, one or more of the semiconductor devices 350 are not attached to the routing structure 352, and are directly attached to the external connectors 308. In some embodiments, no routing structure 352 is present, or more than one routing structure 352 is present.

In accordance with some embodiments, one or more of the semiconductor devices 350 may include devices designed for an intended purpose such as a memory die (e.g., a DRAM die, a stacked memory die, a high-bandwidth memory (HBM) die, etc.), a logic die, a central processing unit (CPU) die, an I/O die, a system-on-a-chip (SoC), a component on a wafer (CoW), an integrated fan-out structure (InFO), a package, the like, or a combination thereof. In some embodiments, one or more of the semiconductor devices 350 include integrated circuit devices, such as transistors, capacitors, inductors, resistors, metallization layers, external connectors, and the like, therein, as desired for a particular functionality. FIG. 15 shows three semiconductor devices 350, but in other embodiments, one, two, or more than three semiconductor devices may be present. In some embodiments, the semiconductor devices 350 may include more than one of the same type of semiconductor device or may include two or more different types of semiconductor devices.

The routing structure 352 may be placed on the external connectors 308 using a suitable process such as a pick-and-place process. For example, the routing structure 352 may be placed such that conductive regions of the routing structure 352 (e.g., contact pads, conductive connectors, solder bumps, or the like) are aligned with corresponding external connectors 308. Once in physical contact, a reflow process may be utilized to bond the external connectors 308 to the conductive regions. As shown in FIG. 15, an underfill 310 may be deposited between the routing structure 352 and the protective layer 104. The underfill 310 may also at least partially surround external connectors 308. The underfill 310 may be a material such as a molding compound, an epoxy, an underfill, a molding underfill (MUF), a resin, or the like, and may be similar to underfill 302 as described previously.

Still referring to FIG. 15, external connectors 312 may be formed on exposed portions of the bottom routing layer (e.g., routing layer 208) of the routing substrate 200. In some embodiments, UBMs are formed on the routing substrate 200, and the external connectors 312 are formed over the UBMs. The external connectors 312 may be, for example, contact bumps or solder balls, although any suitable types of connectors may be utilized. In an embodiment in which the external connectors 312 are contact bumps, the external connectors 312 may include a material such as tin, or other suitable materials, such as silver, lead-free tin, or copper. In an embodiment in which the external connectors 312 are solder bumps, the external connectors 312 may be formed by initially forming a layer of solder using such a technique such as evaporation, electroplating, printing, solder transfer, ball placement, etc. Once a layer of solder has been formed on the structure, a reflow may be performed in order to shape the material into the desired bump shape for the external connectors 312. In some embodiments, the external connectors 312 may be similar to external connectors 220 described above with respect to FIG. 10. In this manner, a package 300 may be formed.

Figure 16:
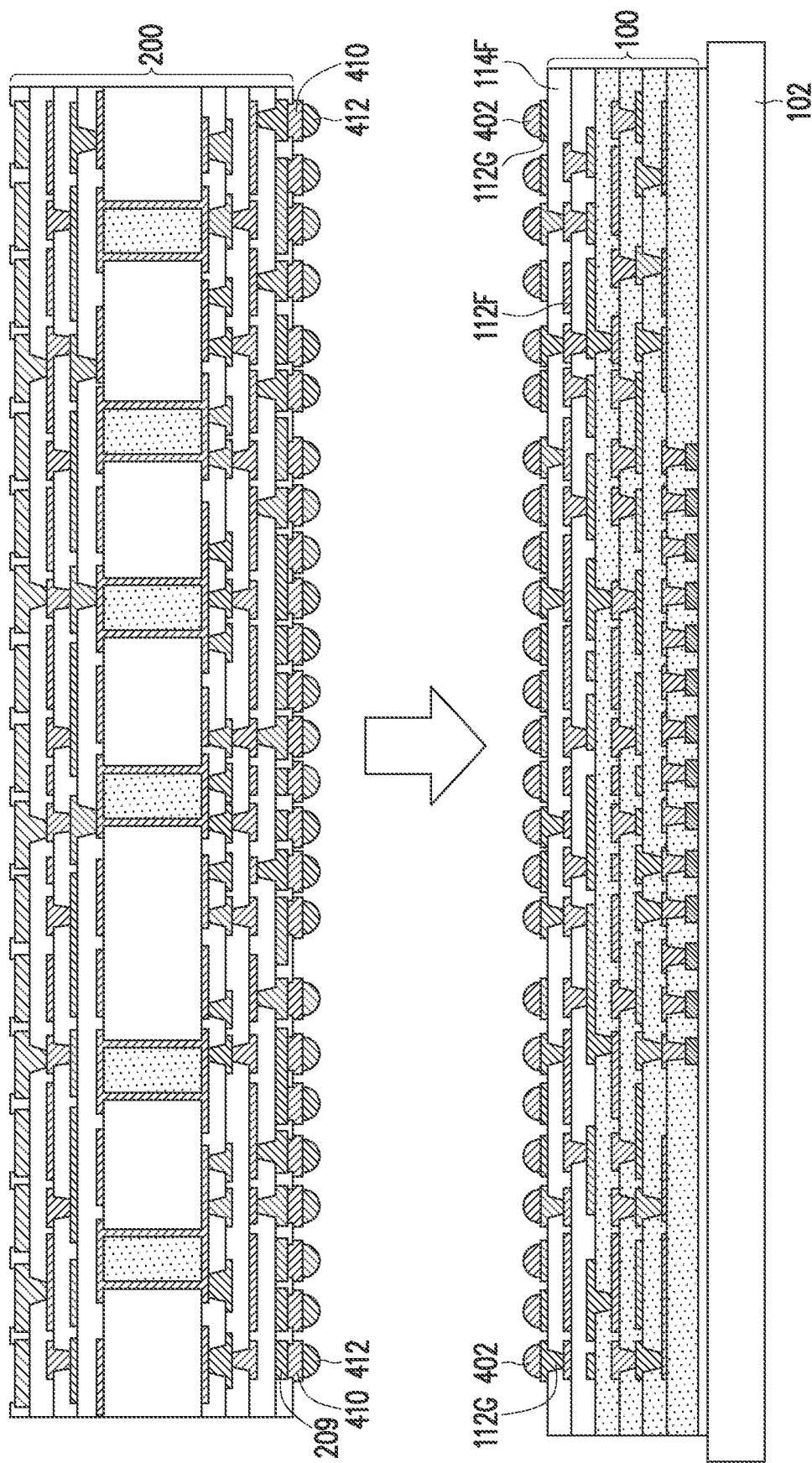
FIGS. 16 and 17 illustrate cross-sectional views of intermediate steps of forming a package, in accordance with some embodiments.
Figure 17:
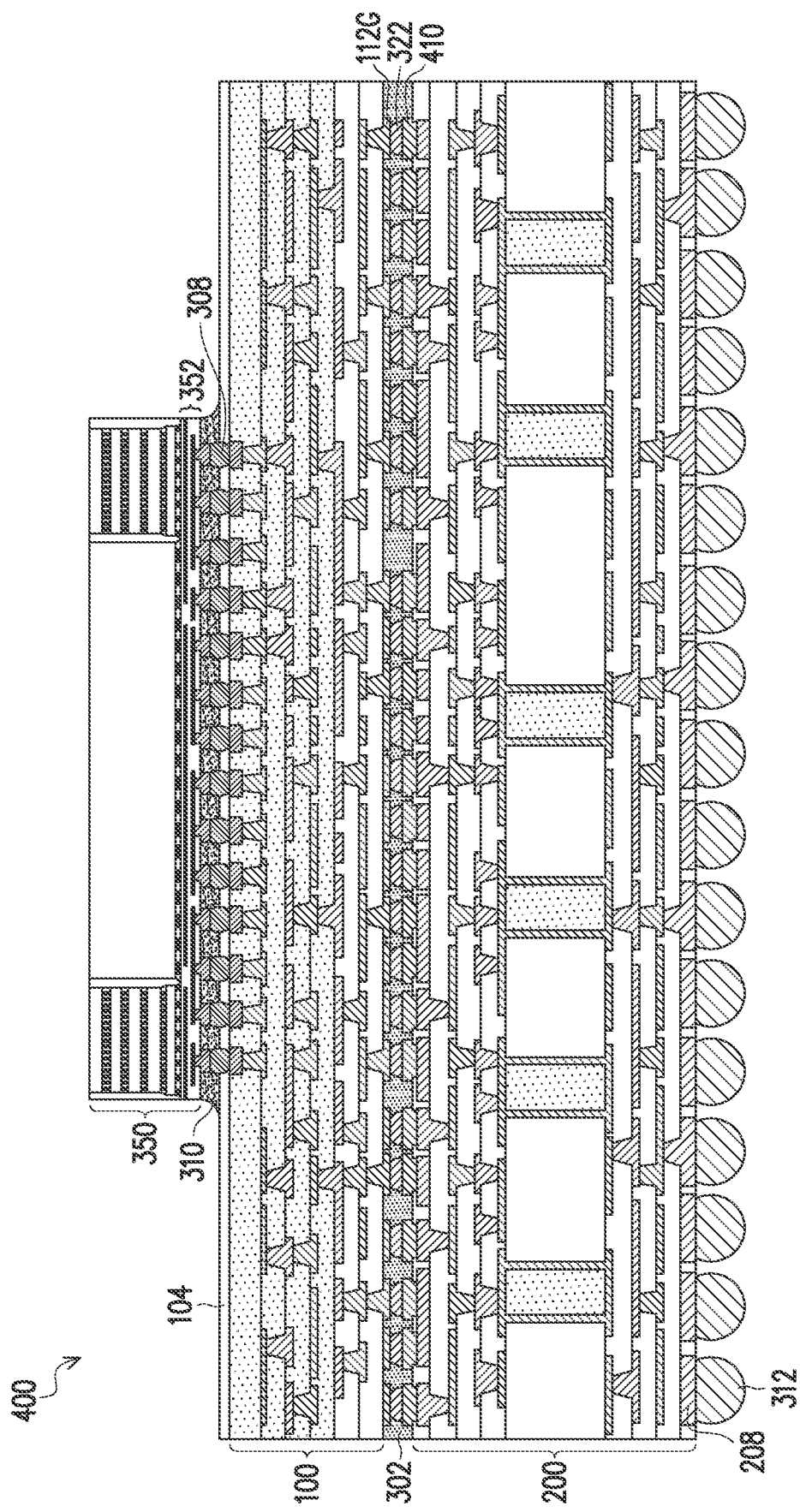
Figure 18:
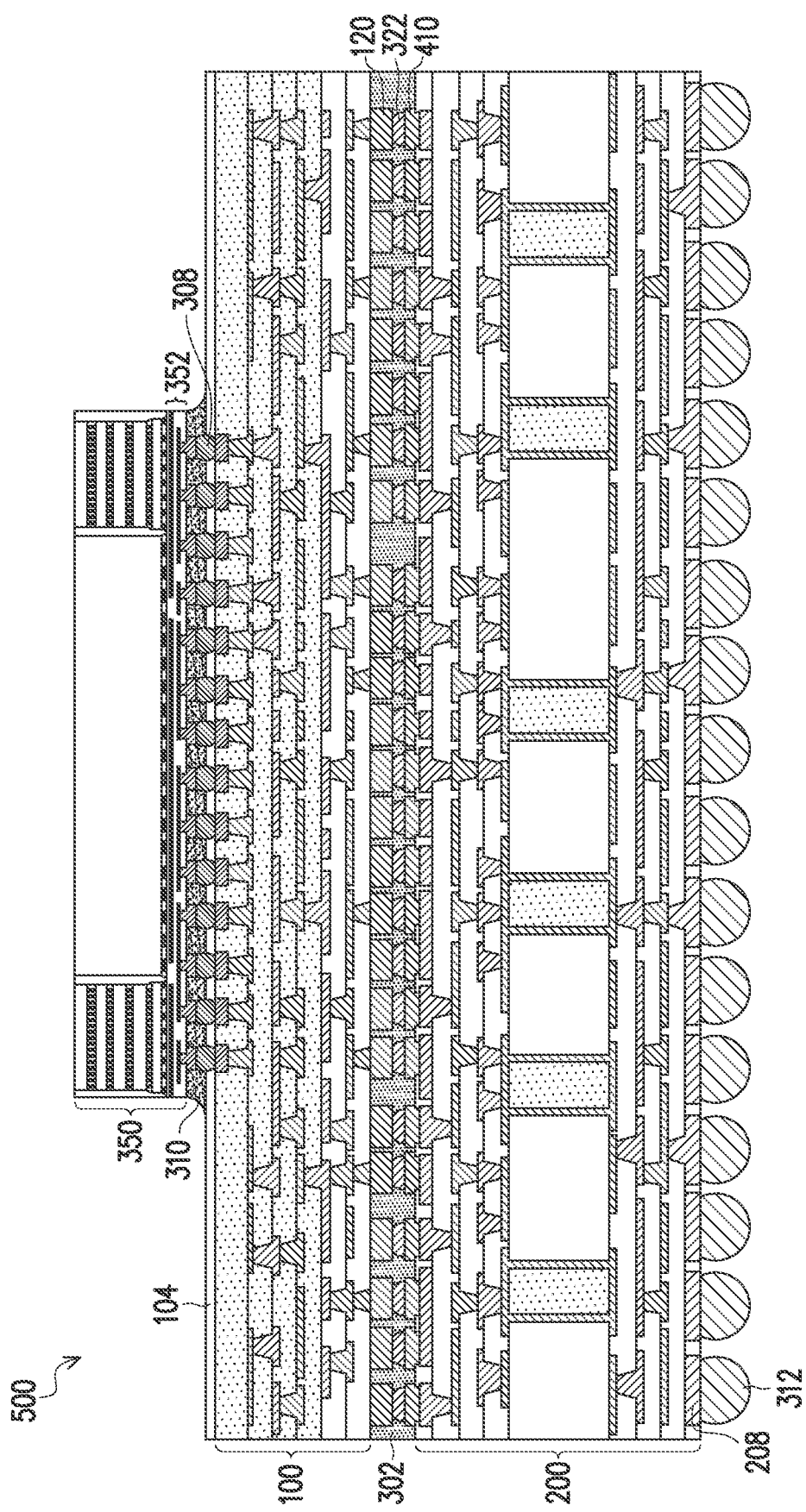
FIG. 18 illustrates a cross-sectional view of a package, in accordance with some embodiments.

FIGS. 16 through 18 illustrate embodiments of a package 400 and a package 500 in which conductive pillars 410 are formed on the routing substrate 200 prior to attachment to the interconnect structure 100. Similar to the advantages described above for the use of conductive pillars 120, forming conductive pillars 410 on the routing substrate 200 can allow for increased connection density, a reduced size of the solder joints 322, a reduced risk of bridging, and a reduced chance of solder joint 322 defects such as deformation or delamination.

Turning first to FIG. 16, an interconnect structure 100 and a routing substrate 200 are shown prior to attachment, in accordance with some embodiments. The interconnect structure 100 is similar to the interconnect structure 100 shown in FIG. 10, except that an additional RDL 112G is formed on the insulating layer 114F instead of conductive pillars 120. The RDL 112G may be formed similar to the other RDLs 112A-F as described previously for FIG. 2. As shown in FIG. 16, the interconnect structure 100 may have solder bumps 402 formed on the RDL 112G. The solder bumps 402 may be formed by initially forming a layer of solder through evaporation, electroplating, printing, solder transfer, ball placement, or the like. Once a layer of solder has been formed on the structure, a reflow may be performed in order to shape the material into the desired solder bump 402 shapes. In some embodiments, the solder bumps 402 are a material such as those described previously for the solder bumps 124 (see FIG. 9) or the external connectors 220 (see FIG. 10), and may be formed in a similar manner.

Still referring to FIG. 16, the routing substrate 200 shown in FIG. 16 is similar to the routing substrate 200 shown in FIG. 10, except that conductive pillars 410 are formed on an outermost routing layer (e.g., routing layer 209). The conductive pillars 410 may be similar to the conductive pillars 120 described previously in FIGS. 6 through 9, and may be formed in a similar manner and of similar materials. The use of conductive pillars 410 allows for a greater density of connections between the routing substrate 200 and the interconnect structure 100. Solder bumps 412 may be formed over the conductive pillars 410, in some embodiments. The solder bumps 412 may be similar to the solder bumps 124 described for FIG. 9, and may be formed in a similar manner. For example, solder caps may be formed on the conductive pillars 410 and then a reflow process may be performed to form the solder bumps 412. In some cases, the use of conductive pillars 410 on the routing substrate 200 allows less solder to be used to form the solder bumps 412 and/or the solder bumps 402. In this manner, the chance of bridging may be reduced, and the connections between the routing substrate 200 and the interconnect structure 100 may be formed closer together.

FIG. 17 shows a package 400 that incorporates the interconnect structure 100 and the routing substrate 200 shown in FIG. 16, in accordance with some embodiments. The package 400 is similar to the package 300 shown in FIG. 15 except for the solder joints 322 connecting the RDL 112G and the conductive pillars 410. The solder joints 322 may be formed in a manner similar to that described for FIGS. 11 and 12. By using conductive pillars 410 formed on the routing substrate 200, the size of the solder joints 322 may be reduced, which can allow an increased connection density and reduce the chance of solder joint 322 deformation or delamination as described previously for package 300.

FIG. 18 illustrates a package 500 that includes an interconnect structure 100 having conductive pillars 120 and a routing substrate having conductive pillars 410, in accordance with some embodiments. The interconnect structure 100 may be similar to the interconnect structure 100 shown in FIG. 15, and the routing substrate 200 may be similar to the routing substrate 200 shown in FIG. 18. Similar to package 300 and package 400 described previously, the use of conductive pillars 120/410 can allow for improved connection layout or improved connection quality between the interconnect structure 100 and the routing substrate 200.

Figure 19:
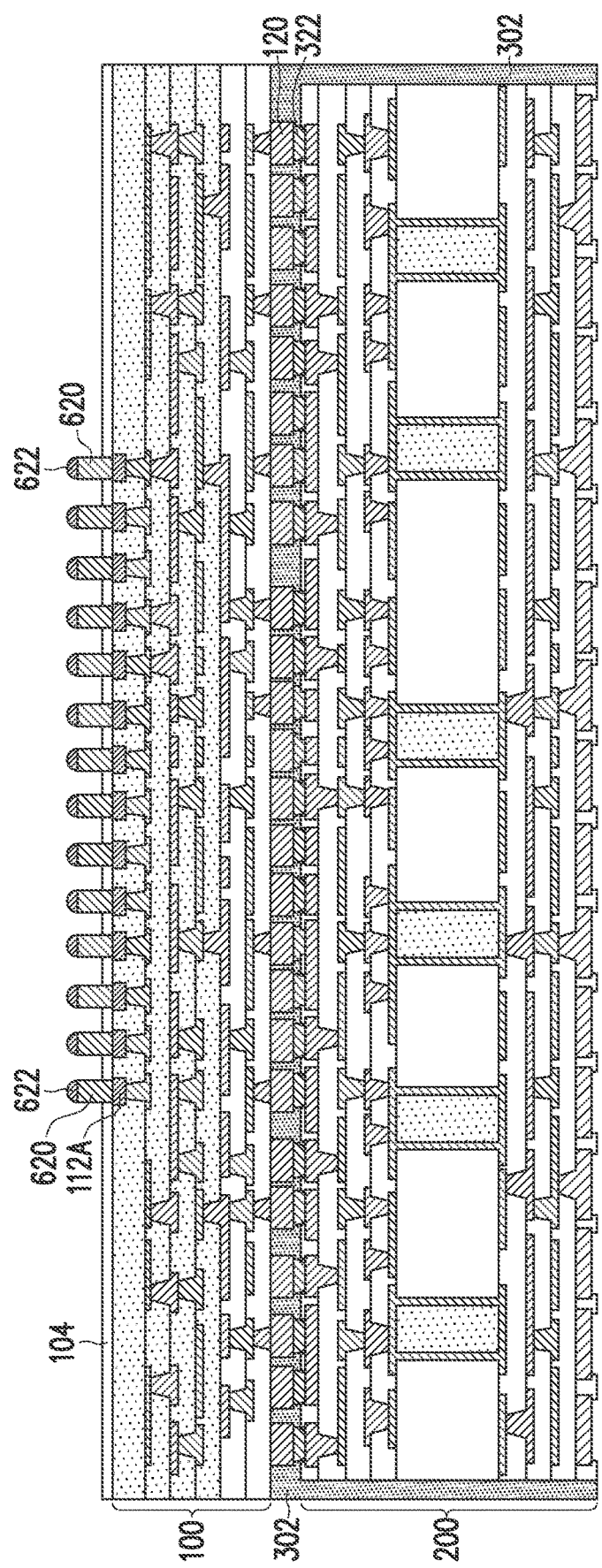
FIGS. 19 and 20 illustrate cross-sectional views of intermediate steps of forming a package, in accordance with some embodiments.
Figure 20:
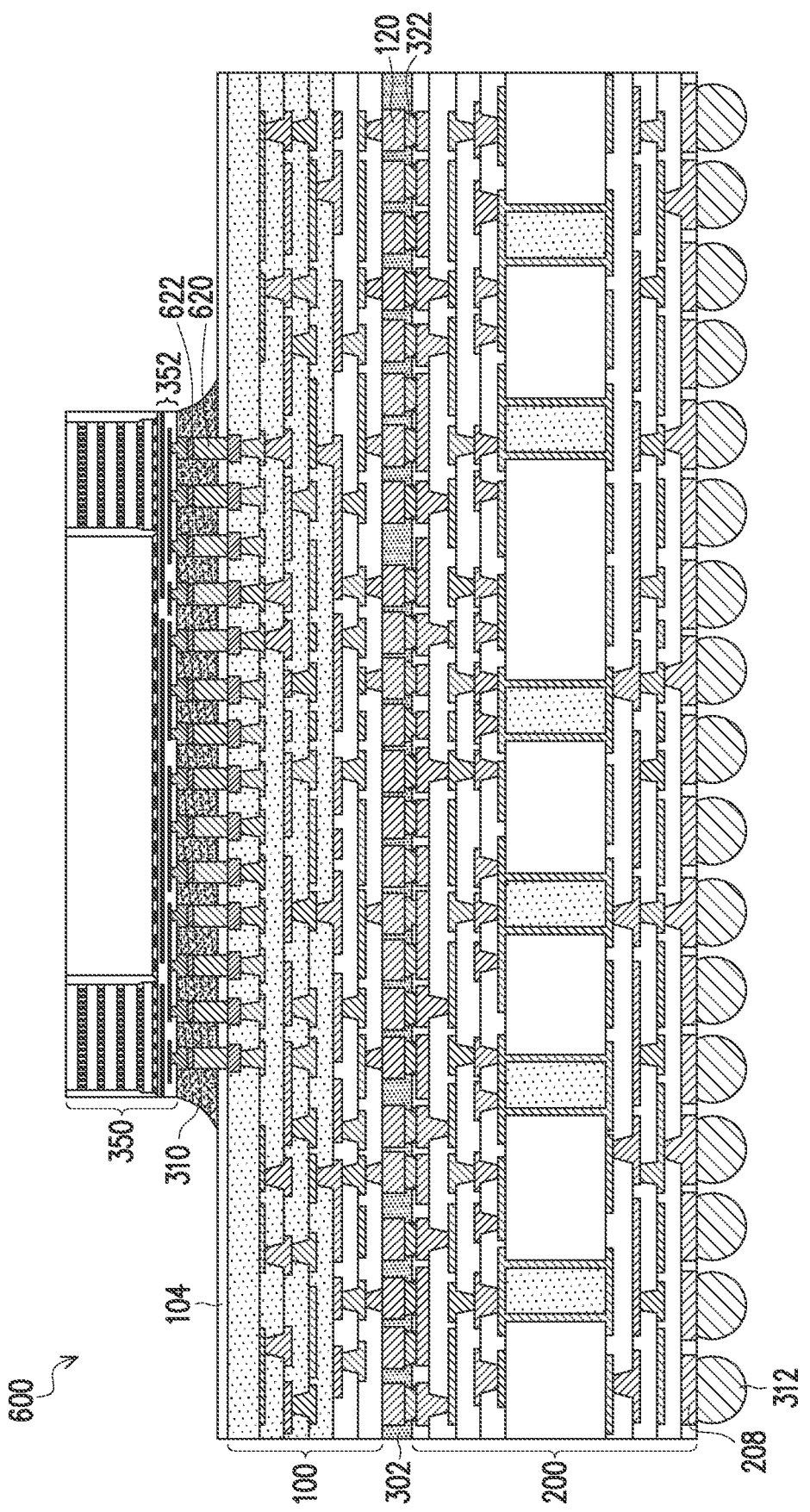

FIGS. 19 and 20 illustrate a package 600 in which the semiconductor devices 350 are connected to the interconnect structure 100 using conductive pillars 620, in accordance with some embodiments. Similar to the advantages described above for the use of conductive pillars 120 or conductive pillars 410, forming conductive pillars 620 to connect the semiconductor devices 350 can allow for increased connection density, a reduced size of the solder bumps (e.g., solder bumps 622) or solder joints, a reduced risk of bridging, and a reduced chance of solder defects such as deformation or delamination. The use of conductive pillars 620 may be combined with other embodiments described herein, such as those shown in FIG. 15, FIG. 17, FIG. 18, FIG. 21, or variations thereof.

Turning first to FIG. 19, an intermediate step of forming a package 600 including an interconnect structure 100 and a routing substrate 200 is shown, in accordance with some embodiments. The structure shown in FIG. 19 is similar to the structure shown in FIG. 14, except conductive pillars 620 are formed on the RDL 112A instead of external connectors 308. The conductive pillars 620 may be formed through openings 306 in the protective layer 104, similar to those shown in FIG. 13. The conductive pillars 620 may be formed in a similar manner as the conductive pillars 120 described previously in FIGS. 6 through 9, and may be formed of similar materials. The use of conductive pillars 620 allows for a greater density of connections between the interconnect structure 100 and the semiconductor devices 350. Solder bumps 622 may be formed over the conductive pillars 620, in some embodiments. The solder bumps 622 may be similar to the solder bumps 124 described for FIG. 9, and may be formed in a similar manner. For example, solder caps may be formed on the conductive pillars 620 and then a reflow process may be performed to form the solder bumps 622. The solder bumps 622 may be formed using different techniques in other embodiments. In some cases, the use of conductive pillars 620 on the interconnect structure 100 allows less solder to be used to form the solder bumps 622. In this manner, the chance of bridging may be reduced, and the connections between the interconnect structure 100 and the semiconductor devices 350 may be formed closer together.

FIG. 20 shows a package 600 in which the semiconductor devices 350 are connected to the interconnect structure 100 using conductive pillars 620, in accordance with some embodiments. The semiconductor devices 350 are shown connected to the conductive pillars 620 through the routing structure 352, but in some embodiments, one or more of the semiconductor devices 350 may be directly connected to the conductive pillars 620. The routing structure 352 may be attached to the conductive pillars 620 in a manner similar to that described for FIG. 15. For example, a pick-and-place technique may be used to align the routing structure 352 to the conductive pillars 620, a reflow process may be performed, and an underfill 310 may be deposited between the routing structure 352 and the interconnect structure 100.

Figure 21:
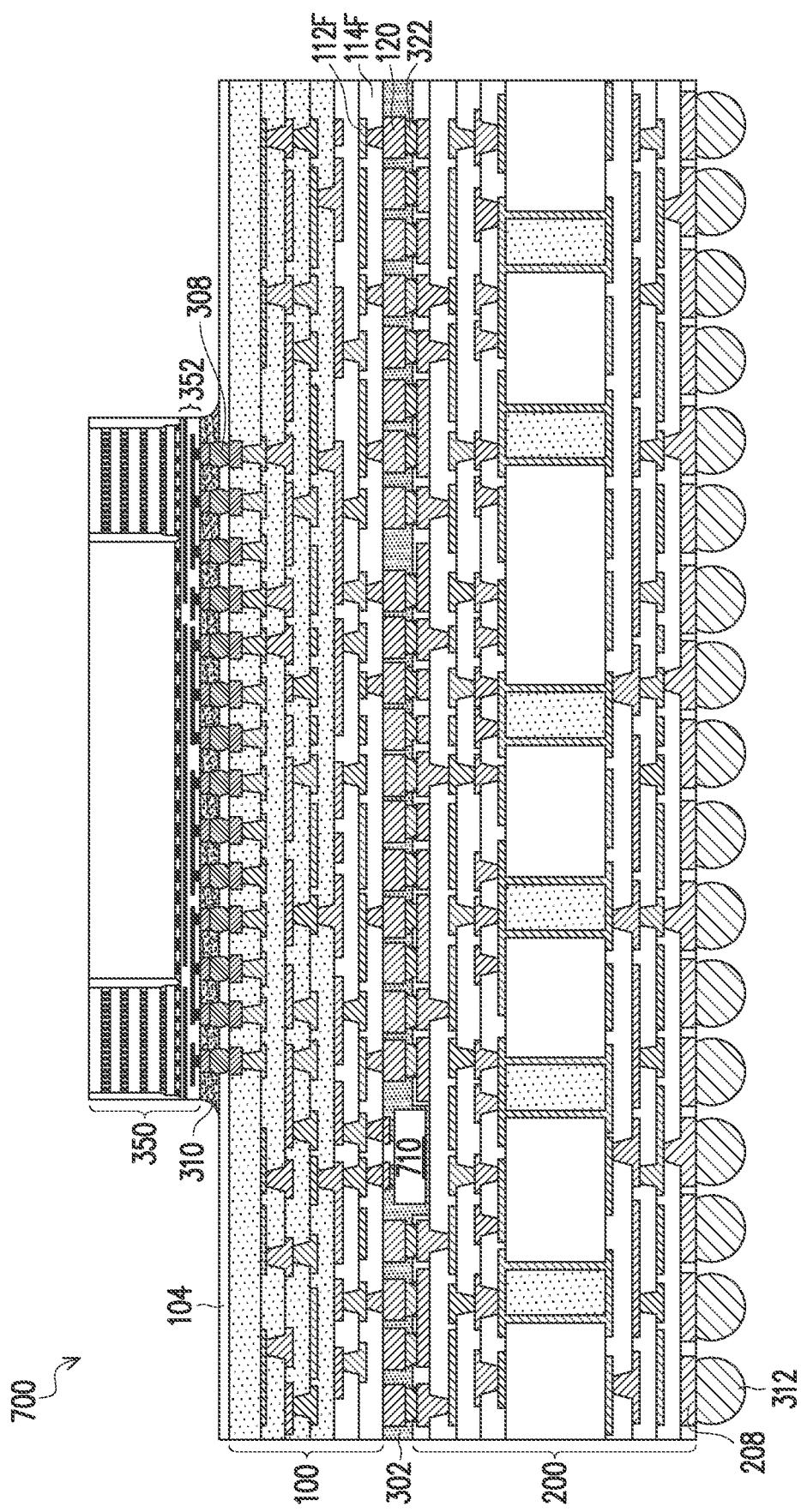
FIG. 21 illustrates a cross-sectional view of a package, in accordance with some embodiments.

FIG. 21 shows a package 700 that includes an electronic device 710, in accordance with some embodiments. The package 700 shown in FIG. 21 is similar to the package 300 shown in FIG. 15, except that the package 700 includes an electronic device 710 between the interconnect structure 100 and the routing substrate 200 (e.g., within the transition layer). The electronic device 710 may be located adjacent the conductive pillars 120, and may be surrounded by the underfill 302. One electronic device 710 is shown in FIG. 21, but multiple electronic devices 710 may be present in other embodiments. In some embodiments, one or more electronic devices 710 may be electrically connected to the interconnect structure 100, as shown in FIG. 21. In some embodiments, one or more electronic devices 710 may be electrically connected to the routing substrate 200. A package 700 may include multiple electronic devices 710 that are variously connected to the interconnect structure 100 and/or the routing substrate 200.

An electronic device 710 may be, for example, a die (e.g., an integrated circuit die, power integrated circuit die, logic die, or the like), a chip, a semiconductor device, a memory device (e.g., SRAM or the like), a passive device (e.g., an integrated passive device (IPD), a multi-layer ceramic capacitor (MLCC), an integrated voltage regulator (IVR), or the like), the like, or a combination thereof. An electronic device 710 may comprise one or more active devices such as transistors, diodes, or the like and/or one or more passive devices such as capacitors, resistors, inductors, or the like. The electronic devices 710 within the package 700 may be similar devices or may be different types of devices. In this manner, different electronic devices 710 can be implemented in the package 700, providing additional functionality and performance benefits. For example, by incorporating electronic devices 710 such as IPDs or IVRs that are coupled to the power routing of the package 700, the stability of the power supplied to the semiconductor devices 350 can be improved. Additionally, by placing the electronic devices 710 within the transition layer, the electronic devices 710 may be located closer to the semiconductor devices 350. For example, electronic devices 710 located within the transition layer may be closer to the semiconductor devices 350 than electronic devices placed on the interconnect structure 100 adjacent the semiconductor devices 350 or placed on the routing substrate 200 adjacent the external connectors 312. The smaller distance between the electronic devices 710 and the semiconductor devices 350 may allow for improved high-speed operation or improved signal stability.

In some embodiments, conductive pads (not individually labeled in FIG. 21) may be formed on the topmost insulating layer (e.g., insulating layer 114F) of the interconnect structure 100, and the electronic devices 710 attached to the conductive pads. Vias may be formed extending through the topmost insulating layer to connect the conductive pads to the topmost RDL (e.g., RDL 112F). The conductive pads and vias may be formed, for example, prior to the formation of the conductive pillars 120 or after the formation of the conductive pillars 120 (see FIGS. 5-8). The conductive pads and vias may be formed in a manner similar to that of the conductive pillars 120 or of the RDLs 112A-F, and may be formed of similar materials.

The electronic devices 710 may be attached to the conductive pads by, for example, sequentially dipping connectors (e.g., conductive bumps or pads) of the electronic devices 710 such as solder balls (not individually labeled) into flux, and then using a pick-and-place tool in order to physically align the connectors of the electronic devices 710 with the conductive pads. In some cases, a reflow process may be performed to bond the connectors of the electronic devices 710. In some cases, the same reflow process may be performed on both the electronic devices 710 and the solder caps 122 (see FIGS. 8-9).

In some embodiments, an underfill (not shown in FIG. 21) is formed between each electronic device 710 and the interconnect structure 100, surrounding the connectors of the electronic devices 710. The underfill may reduce stress and protect the joints from damage resulting from the reflow process. The underfill may be formed by a capillary flow process after the electronic devices 710 are attached, or may be formed by a suitable deposition method before the electronic devices 710 are attached. In some embodiments in which a flux is used to attach the electronic devices 710, it may act as the underfill.

After attaching the electronic devices 710, the package 700 may be subsequently formed in a similar manner as the package 300. The use of electronic devices 710 may be combined with other embodiments described herein, such as those shown in FIG. 15, FIG. 17, FIG. 18, FIG. 20, or variations thereof. In this manner, the design of a package including electronic devices 710 is flexible. For example, the electronic devices 710 may be located in regions within the transition layer suitable for their functionality.

Other features and processes may also be included within the structures or methods described herein. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

By utilizing the embodiments described herein, the performance of a package may be improved, and the reliability of a package may be improved. Different features of embodiments described herein may be combined to achieve these and other benefits. In some cases, the use of conductive pillars to connect a redistribution structure and a routing substrate as described here may allow for increased density of connectors to be used which can improve signal integrity and allow for improved bandwidth during high-speed operation. The use of conductive pillars as described can also allow for a smaller amount of solder to be used, which can reduce the chance of bridging, delamination, or other types of joint defects. Additionally, using process techniques as described may result in improved yield and improved connection reliability. In some cases, electronic devices can be incorporated in a package adjacent the conductive pillars, which can provide additional functionality. For example, electronic devices comprising IPDs or IVRs can improve power integrity of a package. In some cases, the techniques described herein may be performed in a process flow with other typical fabrication processes, and thus may add little or no additional cost to existing processes.

In an embodiment, a package includes a redistribution structure including insulating layers and redistribution layers, wherein the redistribution structure is free of active devices, a semiconductor device on a first side of the redistribution structure, wherein the semiconductor device is connected to a first redistribution layer of the redistribution layers, first conductive pillars protruding from a second side of the redistribution structure, wherein each first conducive pillar of the first conductive pillars is connected to a second redistribution layer of the redistribution layers, an organic substrate including routing layers, wherein each first conductive pillar of the first conductive pillars is respectively connected to the organic substrate by a solder joint, and an encapsulant extending between the redistribution structure and the organic substrate, the encapsulant surrounding each first conductive pillar of the first conductive pillars, wherein the encapsulant, the organic substrate, and the redistribution structure are laterally coterminous. In an embodiment, each first conductive pillar of the first conductive pillars extends between 5 μm and 200 μm from the second side of the redistribution structure. In an embodiment, the package includes an integrated passive device (IPD) within the encapsulant, wherein the IPD is connected to the second redistribution layer. In an embodiment, a first insulating layer of the insulating layers includes a different material than a second insulating layer of the insulating layers. In an embodiment, the first insulating layer includes a polymer and the second insulating layer includes a molding compound. In an embodiment, the semiconductor device is electrically connected to a first redistribution layer of the redistribution layers by second conductive pillars, wherein the second conductive pillars protrude from the first side of the redistribution structure. In an embodiment, a width of each solder joint is less than a width of the respective first conductive pillar to which it is connected. In an embodiment, the first conductive pillars have a pitch between 150 μm and 1000 μm. In an embodiment, the package includes second conductive pillars on the organic substrate, wherein each solder joint connects a first conductive pillar to a second conductive pillar. In an embodiment, the package includes third conductive pillars protruding from the first side of the redistribution structure and connected to the first redistribution layer of the redistribution layers, wherein the semiconductor device is connected to the third conductive pillars.

In an embodiment, a semiconductor package includes an interconnect structure including a redistribution structure, an insulating layer over the redistribution structure, and conductive pillars on the insulating layer, wherein the conductive pillars are connected to the redistribution structure, wherein the interconnect structure is free of active devices, a routing substrate including a routing layer over a core substrate, wherein the interconnect structure is bonded to the routing substrate by solder joints, wherein each of the solder joints bonds a conductive pillar of the conductive pillars to the routing layer, an underfill surrounding the conductive pillars and the solder joints, and a semiconductor device including a semiconductor die connected to a routing structure, wherein the routing structure is bonded to an opposite side of the interconnect structure as the routing substrate. In an embodiment, the conductive pillars extend a first distance from the insulating layer, wherein the interconnect structure and the routing substrate are separated by a second distance, wherein the first distance is greater than half of the second distance. In an embodiment, a sidewall of the interconnect structure is coplanar with a sidewall of the routing substrate. In an embodiment, the semiconductor package includes a passive device connected to the interconnect structure, wherein the passive device is between the interconnect structure and the routing substrate. In an embodiment, the solder joints have a height greater than the separation distance. In an embodiment, the conductive pillars are laterally separated by a distance in the range of 150 µm and 1000 µm.

In an embodiment, a method includes forming a redistribution structure on a carrier, plating conductive pillars extending from a first side of the redistribution structure, forming first solder bumps on the conductive pillars, connecting a routing substrate to the plurality of conductive pillars using the first solder bumps, depositing a molding material between the redistribution structure and the routing substrate, removing the carrier, and after removing the carrier, connecting a semiconductor device to a second side of the redistribution structure. In an embodiment, forming the solder bumps on the conductive pillars includes depositing solder caps on the conductive pillars and performing a reflow process on the solder caps. In an embodiment, the method includes connecting an integrated passive device (IPD) to the first side of the redistribution structure. In an embodiment, connecting the routing substrate to the conductive pillars using the first solder bumps includes bonding the first solder bumps to corresponding second solder bumps on the routing substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a redistribution structure on a carrier;
    plating a plurality of conductive pillars extending from a first side of the redistribution structure;
    forming first solder bumps on the plurality of conductive pillars, wherein the first solder bumps have a width that is less than a width of the conductive pillars;
    connecting a routing substrate to the plurality of conductive pillars using the first solder bumps;
    depositing a molding material between the redistribution structure and the routing substrate;
    removing the carrier; and
    after removing the carrier, connecting a semiconductor device to a second side of the redistribution structure.

2. The method of claim 1, wherein forming the first solder bumps on the plurality of conductive pillars comprises depositing solder material on the plurality of conductive pillars and performing a reflow process on the solder material.

3. The method of claim 1, wherein forming the first solder bumps on the plurality of conductive pillars comprises placing solder balls on the conductive pillars of the plurality of conductive pillars.

4. The method of claim 1, further comprising connecting an integrated passive device (IPD) to the first side of the redistribution structure.

5. The method of claim 1, wherein connecting the routing substrate to the plurality of conductive pillars using the first solder bumps comprises bonding the first solder bumps to corresponding second solder bumps on the routing substrate.

6. The method of claim 1, wherein the molding material covers sidewalls of the routing substrate.

7. The method of claim 1, wherein a height of the first solder bumps is less than a height of the conductive pillars.

8. A method comprising:
    forming a plurality of first copper pillars on a first metallization layer on a first side of a first interconnect structure, wherein the plurality of first copper pillars protrude from the first side of the first interconnect structure, wherein a height of the first copper pillars is greater than a height of the first metallization layer;
    forming a plurality of first solder caps on the plurality of first copper pillars;
    performing a first reflow process on the plurality of first solder caps;
    forming a plurality of second copper pillars on a second metallization layer on a first side of a second interconnect structure, wherein the plurality of second copper pillars protrude from the first side of the second interconnect structure, wherein a height of the second copper pillars is greater than a height of the second metallization layer;
    forming a plurality of second solder caps on the plurality of second copper pillars;
    after performing the first reflow process on the plurality of first solder caps, bonding the plurality of first solder caps to the plurality of second solder caps, comprising performing a second reflow process; and
    surrounding the plurality of first copper pillars and the plurality of second copper pillars with an underfill material.

9. The method of claim 8, wherein forming the plurality of first solder caps comprises plating a solder material on the plurality of first copper pillars.

10. The method of claim 8, wherein the first interconnect structure comprises a core substrate.

11. The method of claim 8 further comprising forming a plurality of third copper pillars on a second side of the second interconnect structure, wherein the plurality of third copper pillars protrude from the second side of the second interconnect structure.

12. The method of claim 11 further comprising bonding a semiconductor die to the plurality of third copper pillars.

13. The method of claim 11, wherein the third copper pillars have a width that is smaller than a width of the second copper pillars.

14. The method of claim 8, wherein each first copper pillar has a height that is less than its width.

15. The method of claim 8, wherein after performing the first reflow process, each first solder cap has a width that is less than a width of its underlying first copper pillar.

16. A method comprising:
   depositing a first dielectric layer over a redistribution layer of a redistribution structure;
   patterning the first dielectric layer to expose portions of the redistribution layer;
   forming a plurality of conductive posts on the first dielectric layer and the exposed portions of redistribution layer, comprising:
      depositing a seed layer over the first dielectric layer and the exposed portions of the redistribution layer;
      depositing a photoresist over the seed layer;
      patterning a plurality of openings in the photoresist that expose the seed layer; and
      plating a metal into the plurality of openings;
   plating a solder material into the plurality of openings; and
   bonding an interconnect structure to the solder material.

17. The method of claim 16 further comprising bonding a semiconductor device to the redistribution structure opposite the interconnect structure.

18. The method of claim 16 further comprising performing a reflow process on the solder material before bonding the interconnect structure to the solder material.

19. The method of claim 16 further comprising connecting an integrated passive device (IPD) to the redistribution layer before bonding the interconnect structure to the solder material.

20. The method of claim 16 further comprising depositing a molding material between the interconnect structure and the redistribution structure.

* * * * *